(12) United States Patent
Kobayashi

(10) Patent No.: US 11,509,849 B2
(45) Date of Patent: Nov. 22, 2022

(54) IMAGING DEVICE, IMAGING SYSTEM, AND MOVING BODY

(71) Applicant: CANON KABUSHIKI KAISHA, Tokyo (JP)

(72) Inventor: Hideo Kobayashi, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 17/346,883

(22) Filed: Jun. 14, 2021

(65) Prior Publication Data

US 2021/0306589 A1 Sep. 30, 2021

Related U.S. Application Data

(60) Continuation of application No. 16/862,935, filed on Apr. 30, 2020, now Pat. No. 11,064,145, which is a
(Continued)

(30) Foreign Application Priority Data

Feb. 9, 2018 (JP) .............................. JP2018-022402

(51) Int. Cl.
*H04N 5/3745* (2011.01)
*H01L 27/146* (2006.01)
(Continued)

(52) U.S. Cl.
CPC ....... *H04N 5/37455* (2013.01); *H01L 27/146* (2013.01); *H01L 27/1461* (2013.01);
(Continued)

(58) Field of Classification Search
CPC .... H04N 5/37455; H04N 5/379; H04N 5/378; H04N 5/3575; H04N 5/365; H04N 5/3653; H04N 5/3742; H04N 5/3745; H01L 27/1461; H01L 27/14634; H01L 27/146; H01L 27/14643; H01L 27/14609; H01L 27/14636; H01L 27/14612;
(Continued)

(56) References Cited

U.S. PATENT DOCUMENTS 7,538,304 B2* 5/2009 Ladd .................. H04N 5/37457
250/214 R
8,253,836 B2* 8/2012 Tsuchiya ................ H04N 5/343
348/304
(Continued)

FOREIGN PATENT DOCUMENTS

CN 102148618 A 8/2011
CN 106840109 A 6/2017
(Continued)

*Primary Examiner* — Pritham D Prabhakher
(74) *Attorney, Agent, or Firm* — Canon U.S.A., Inc. IP Division

(57) ABSTRACT

In an imaging device, a differential stage includes an input transistor having an input node connected to a floating diffusion portion, a first control line and a second control line are located in a plurality of sets, the first control line is connected to connection portions of some sets of the plurality of sets, and the second control line is connected to connection portions of the other sets of the plurality of sets.

12 Claims, 22 Drawing Sheets

Related U.S. Application Data division of application No. 16/267,178, filed on Feb. 4, 2019, now Pat. No. 10,687,009.

(51) Int. Cl.
*H04N 5/369* (2011.01)
*H04N 5/378* (2011.01)

(52) U.S. Cl.
CPC ....... *H01L 27/14634* (2013.01); *H04N 5/378* (2013.01); *H04N 5/379* (2018.08)

(58) Field of Classification Search
CPC ......... H01L 27/14645; H01L 27/14621; H01L 27/14627; H03M 1/56; G02B 3/0056; B60R 1/00; G01S 1/00; G01S 11/12; G01C 3/08
USPC .......................................................... 348/308
See application file for complete search history.

(56) References Cited

U.S. PATENT DOCUMENTS

| | | | |
|---|---|---|---|
| 9,148,596 B1* | 9/2015 | Sun | H04N 5/357 |
| 9,344,267 B2* | 5/2016 | Chen | H04L 7/0331 |
| 9,961,292 B1* | 5/2018 | Deng | H04N 5/3745 |
| 10,334,193 B2* | 6/2019 | Cho | H04N 5/3745 |
| 10,504,949 B2* | 12/2019 | Kobayashi | H04N 5/3742 |
| 10,707,256 B2* | 7/2020 | Nakamizo | H01L 27/14656 |
| 10,805,561 B2* | 10/2020 | Sakakibara | H04N 5/378 |
| 2002/0190215 A1* | 12/2002 | Tashiro | H04N 5/3559 |
| | | | 348/E5.088 |
| 2006/0192867 A1 | 8/2006 | Yosefin | |
| 2007/0235631 A1* | 10/2007 | Ladd | H04N 5/3651 |
| | | | 348/E3.021 |
| 2008/0170137 A1* | 7/2008 | Matsumoto | H04N 5/347 |
| | | | 348/241 |
| 2012/0268619 A1 | 10/2012 | Uchida | |
| 2012/0286139 A1* | 11/2012 | Tashiro | H01L 27/146 |
| | | | 250/208.1 |
| 2013/0100326 A1* | 4/2013 | Ueno | H04N 5/357 |
| | | | 348/300 |
| 2015/0229859 A1* | 8/2015 | Guidash | H04N 5/378 |
| | | | 348/308 |
| 2016/0360138 A1 | 12/2016 | Meynants | |
| 2017/0257590 A1 | 9/2017 | Kato | |
| 2017/0272678 A1 | 9/2017 | Sakakibara | |
| 2017/0318250 A1 | 11/2017 | Sakakibara | |
| 2018/0013412 A1 | 1/2018 | Kikuchi | |
| 2018/0102386 A1* | 4/2018 | Kobayashi | H04N 5/3559 |
| 2018/0288346 A1* | 10/2018 | Yoshida | H04N 5/363 |
| 2019/0273883 A1* | 9/2019 | Sakakibara | H04N 5/3535 |

FOREIGN PATENT DOCUMENTS

| | | |
|---|---|---|
| JP | 2008-042676 A | 2/2008 |
| JP | 2012-222632 A | 11/2012 |
| JP | 2013-109391 A | 6/2013 |
| JP | 2016-092661 A | 5/2016 |
| JP | 2016-92662 A | 5/2016 |
| JP | 2017-130872 A | 7/2017 |
| WO | 2016/009832 A1 | 1/2016 |
| WO | 2016/136448 A1 | 9/2016 |

* cited by examiner

FIG.20B
FRONT VIEW
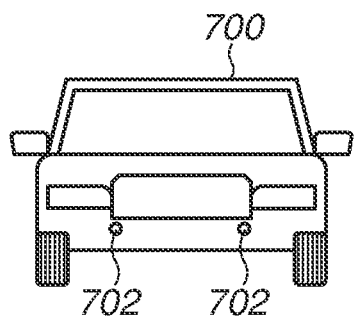
TOP VIEW
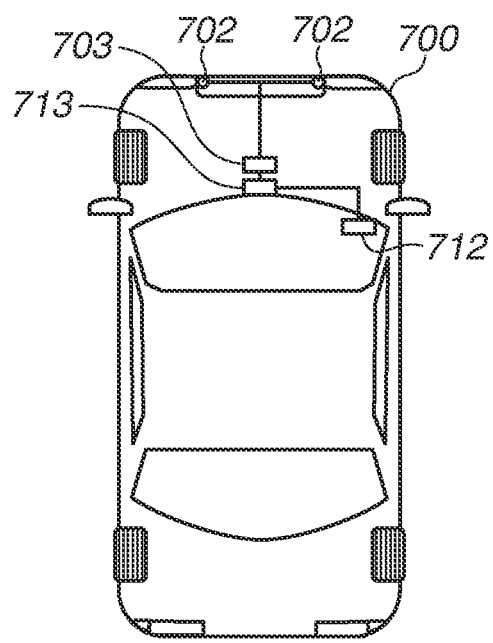
BACK VIEW
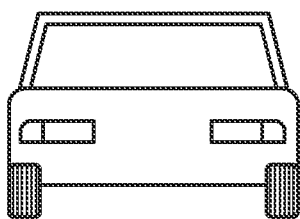

IMAGING DEVICE, IMAGING SYSTEM, AND MOVING BODY

CROSS-REFERENCE TO RELATED APPLICATION

This application is a Continuation of U.S. application Ser. No. 16/862,935, filed Apr. 30, 2020; which is a Divisional of U.S. application Ser. No. 16/267,178, filed Feb. 4, 2019, now U.S. patent Ser. No. 10/687,009, issued Jun. 16, 2020; which claims priority from Japanese Patent Application No. 2018-022402 filed Feb. 9, 2018, which are hereby incorporated by reference herein in their entireties.

BACKGROUND OF THE INVENTION

Field of the Invention

Aspects of the present invention generally relate to an imaging device, an imaging system, and a moving body.

Description of the Related Art

There is known an imaging device including a photoelectric conversion portion and an AD conversion portion, which performs analog-to-digital (AD) conversion of a signal output from the photoelectric conversion portion.

As an example of such an imaging device, International Publication No. 2016/009832 discusses an imaging device including a plurality of sets each including a photoelectric conversion portion, a floating diffusion portion, and a differential stage. In the imaging device discussed therein, a transistor having an input node connected to the floating diffusion portion operates as one input transistor of a plurality of input transistors included in the differential stage. A ramp signal is input to the other input transistor of the plurality of input transistors. The differential stage operates as a comparator which outputs a signal indicating a result obtained by comparing the electric potential of the input node of the one input transistor with that of the input node of the other transistor. An output from the differential stage operating as such a comparator is used to generate a digital signal corresponding to electric charges accumulated by the photoelectric conversion portion.

SUMMARY OF THE INVENTION

According to an aspect of the present invention, an imaging device includes a plurality of sets each including a photoelectric conversion portion, a floating diffusion portion connected to the photoelectric conversion portion, and a differential stage, wherein the differential stage includes an input transistor having an input node connected to the floating diffusion portion, wherein each of the plurality of sets includes a connection portion connected to the input node and a predetermined node, wherein a first control line and a second control line are located in the plurality of sets, wherein the first control line is connected to the connection portions of some sets of the plurality of sets, and wherein the second control line is connected to the connection portions of the other sets of the plurality of sets.

Further features of the present invention will become apparent from the following description of exemplary embodiments with reference to the attached drawings.

BRIEF DESCRIPTION OF THE DRAWINGS

FIGS. 20A and 20B are block diagrams of an imaging system and a moving body according to a ninth exemplary embodiment.

DESCRIPTION OF THE EMBODIMENTS

In the imaging device discussed in International Publication No. 2016/009832, a kickback noise, which is generated when the output of the differential stage changes, is not taken into consideration. When a kickback noise generated at the differential stage of a set is transmitted to the differential stage of another set, the electric potential of an input transistor of the differential stage of such another set undergoes a change, so that the accuracy in comparison decreases. Therefore, there is an issue in which the accuracy of AD conversion decreases.

The technique described below relates to an imaging device in which a decrease in AD conversion accuracy is prevented or reduced by preventing or reducing a kickback noise generated at the differential stage of a set from being transmitted to the differential stage of another set.

Various exemplary embodiments, features, and aspects of the invention will be described in detail below with reference to the drawings.

Figure 1:
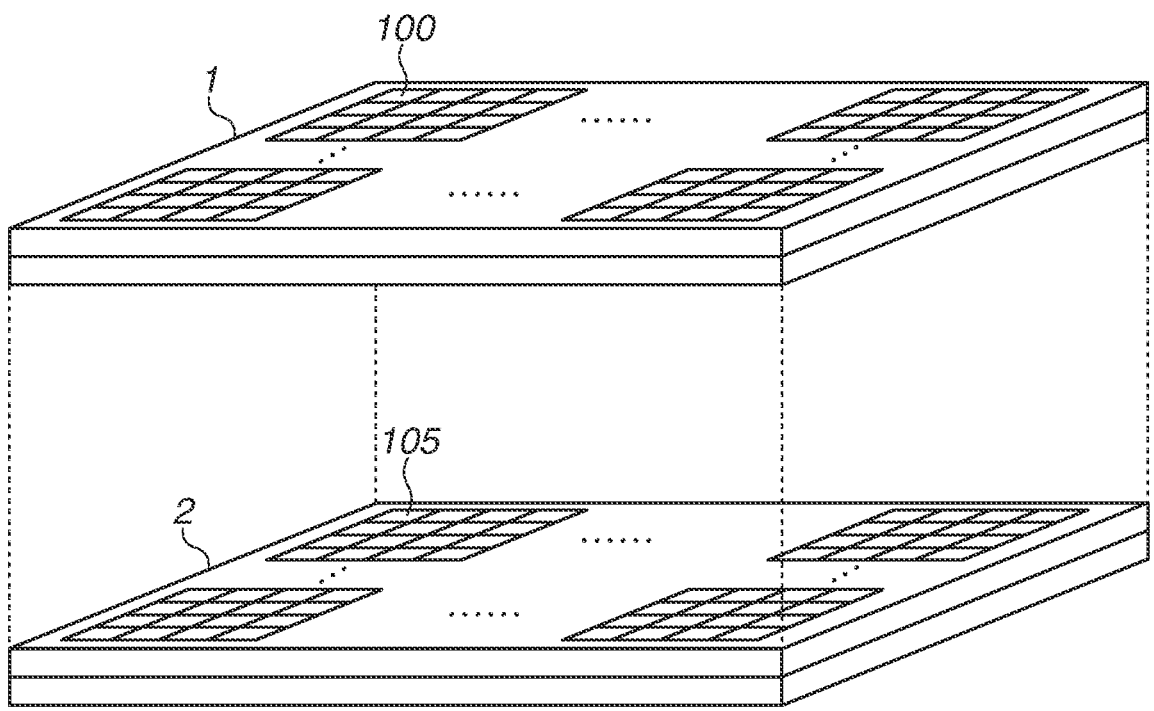
FIG. 1 is a schematic diagram of an imaging device according to a first exemplary embodiment.

FIG. 1 is a diagram illustrating a first chip 1 and a second chip 2, which are included in an imaging device according to a first exemplary embodiment. In the first chip 1, pixels 100 are arranged over a plurality of rows and a plurality of columns. Moreover, in the second chip 2, signal processing circuits 105 are arranged over a plurality of rows and a plurality of columns. Furthermore, while, FIG. 1, only illustrates the pixels 100 and the signal processing circuits 105, it will be appreciated that the chips may also include other components such as, for example, control lines used to control the pixels 100 and signal lines used to transfer signals that are based on electric charges accumulated by the pixels 100 may be arranged in the first chip 1 and the second chip 2 as appropriate. Moreover, driving circuits, such as a vertical scanning circuit and a timing generator, may be arranged in the first chip 1 or the second chip 2 as appropriate.

Figure 2:
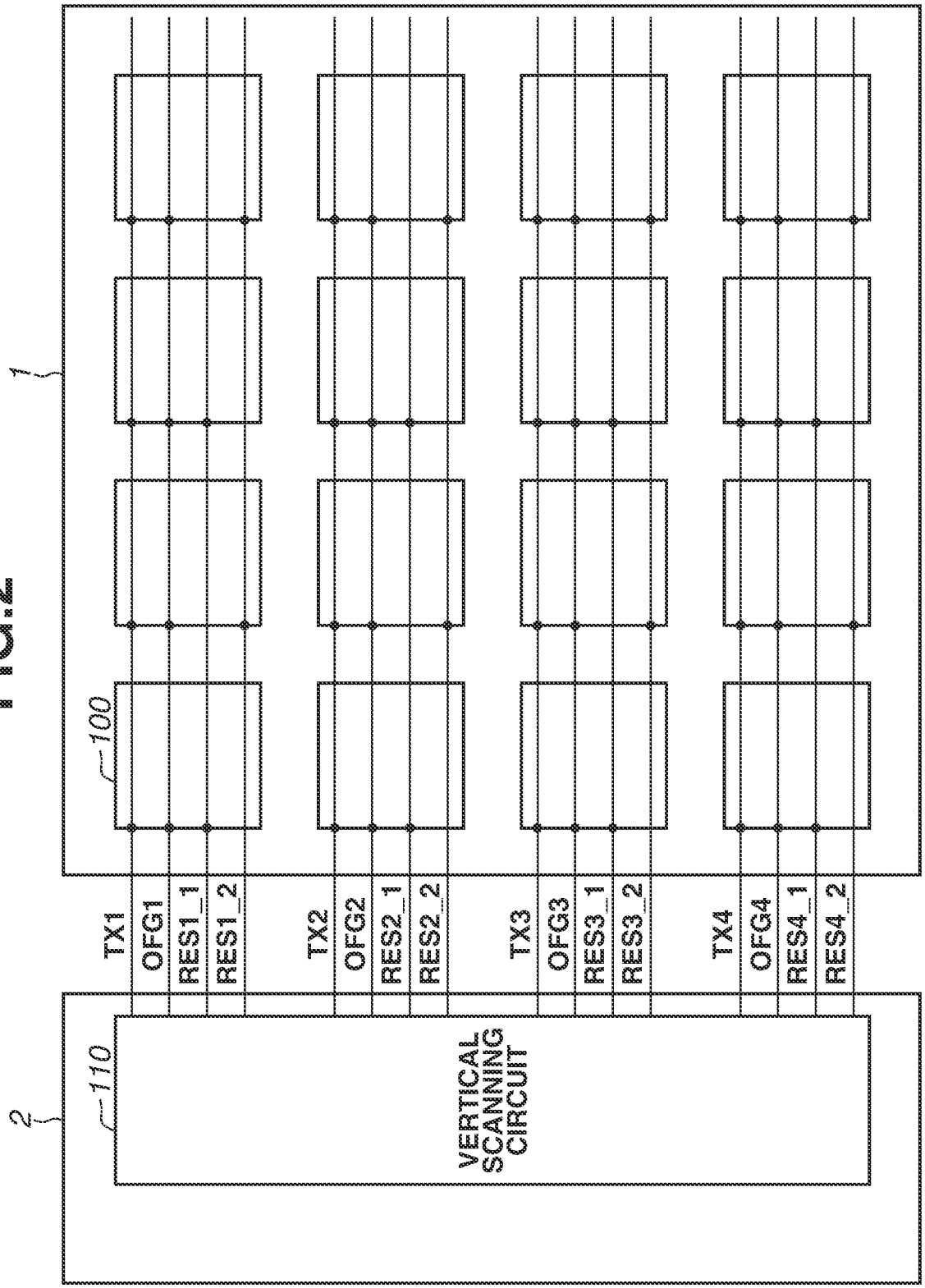
FIG. 2 is a block diagram of the imaging device according to the first exemplary embodiment.

FIG. 2 is a block diagram illustrating a configuration of the imaging device according to the first exemplary embodiment.

In the imaging device according to the first exemplary embodiment, pixels 100 are arranged over a plurality of rows and a plurality of columns. In FIG. 2, a vertical scanning circuit 110 is also illustrated. The pixels 100 are provided in the first chip 1. The vertical scanning circuit 110 is provided in the second chip 2. The vertical scanning circuit 110 outputs signals Txn, OFGn, RESn_1, and RESn_2 to the pixels 100. Letter "n" used in reference characters of these signals indicates the row of the pixel 100. For example, in the case of a signal TX1, since n is equal to 1, this signal is a signal TX which is output to the pixels 100 in the first row. The signal RESn_1 is output to the pixels 100 in the odd-numbered columns, and the signal RESn_2 is output to the pixels 100 in the even-numbered columns. In other words, a control line used for transferring the signal RESn_1 and a control line used for transferring the signal RESn_2 are provided as a plurality of control lines with respect to the pixels 100 in a plurality of columns in one row. Then, some pixels 100 of the pixels 100 in the plurality of columns are connected to the control line used for transferring the signal RESn_1, and the other pixels 100 of the pixels 100 in the plurality of columns are connected to the control line used for transferring the signal RESn_2.

Figure 3:
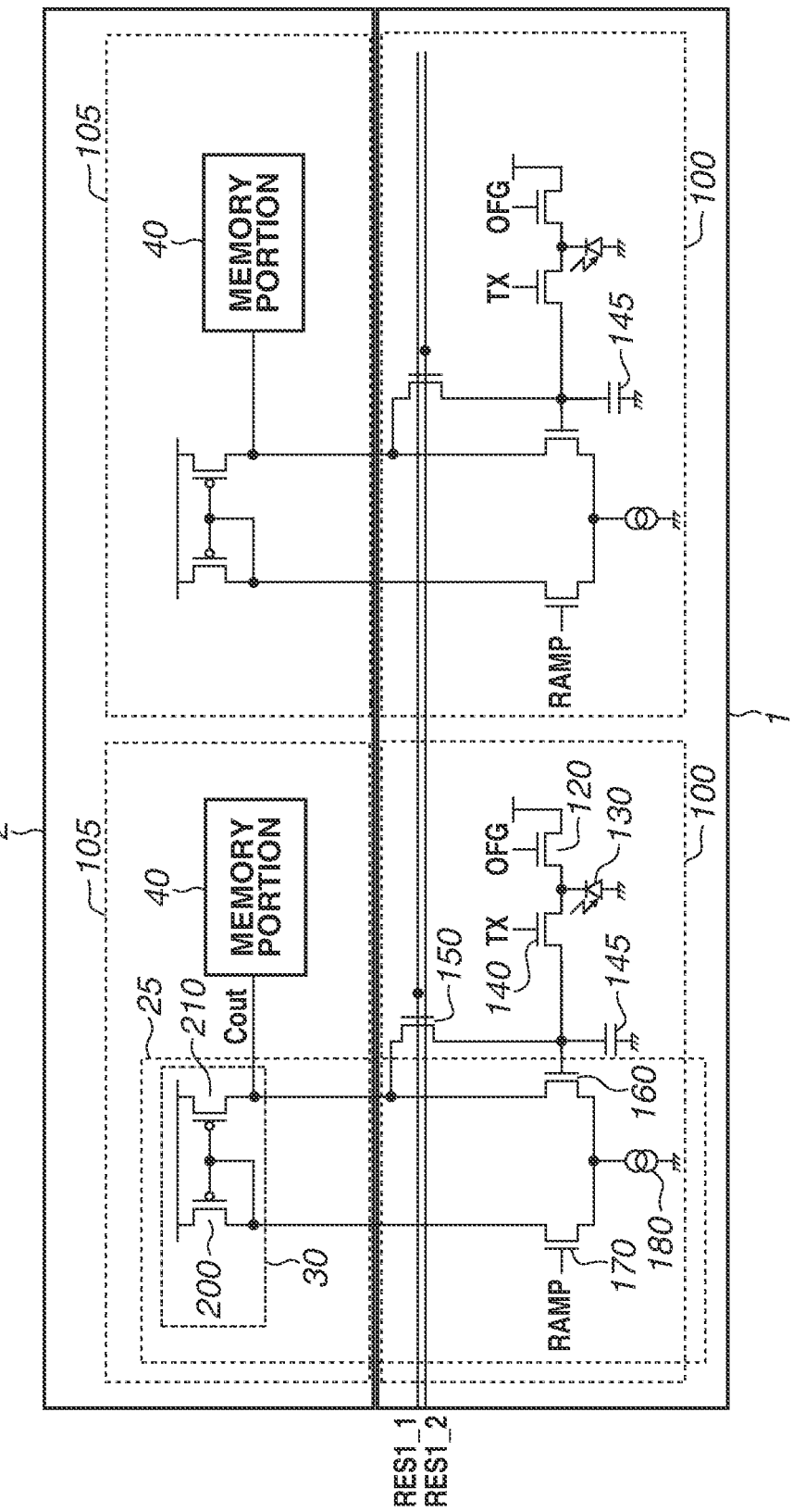
FIG. 3 is a circuit diagram of the imaging device according to the first exemplary embodiment.

FIG. 3 is a circuit diagram illustrating circuits of the pixels 100 illustrated in FIG. 2 and circuits of the signal processing circuits 105 of the second chip 2.

The pixel 100 includes a transistor 120, a photoelectric conversion portion 130, and a transistor 140. Moreover, the pixel 100 further includes a floating diffusion portion 145, a transistor 150, an input transistor 160, an input transistor 170, and a current source 180.

A ramp signal RAMP is input from a ramp signal generation unit (not illustrated) to the input transistor 170. The ramp signal RAMP is a signal the electric potential of which monotonously changes with time. The term "monotonously changing" as used herein means that the direction of a change of the electric potential is maintained to be the same direction during a period from the start of the change to the end thereof. Even in a case where, during a period from the start of the change to the end thereof, there is a change in the rate of change in electrical potential per unit time of the ramp signal, this also falls within the range of monotonously changing of electric potential.

Each of the transistors 120, 140, and 150 and the input transistors 160 and 170 is an N-type metal-oxide semiconductor (MOS) transistor.

The signal processing circuits 105 includes a current mirror circuit portion 30. The current mirror circuit portion 30 includes transistors 200 and 210. Moreover, the signal processing circuits 105 further includes a memory portion 40. A count signal obtained by counting a clock signal is input from a counter circuit (not illustrated) to the memory portion 40.

Each of the transistors 200 and 210 is a P-type MOS transistor.

A differential stage 25 includes the current mirror circuit portion 30, the input transistor 160, the input transistor 170, and the current source 180. The differential stage 25 operates as a comparator which compares the electric potential of the input node of the input transistor 160 with the electric potential of the input node of the input transistor 170. Moreover, the differential stage 25 outputs, to the memory portion 40, a signal Cout, which is a comparison result signal indicating a result of comparing the electric potential of the input node of the input transistor 160 with the electric potential of the input node of the input transistor 170. A differential pair is formed by the input transistor 160 and the input transistor 170. The differential stage 25 and the memory portion 40 serve as an AD conversion portion which obtains a digital signal corresponding to the electric potential of the floating diffusion portion 145.

Figure 4:
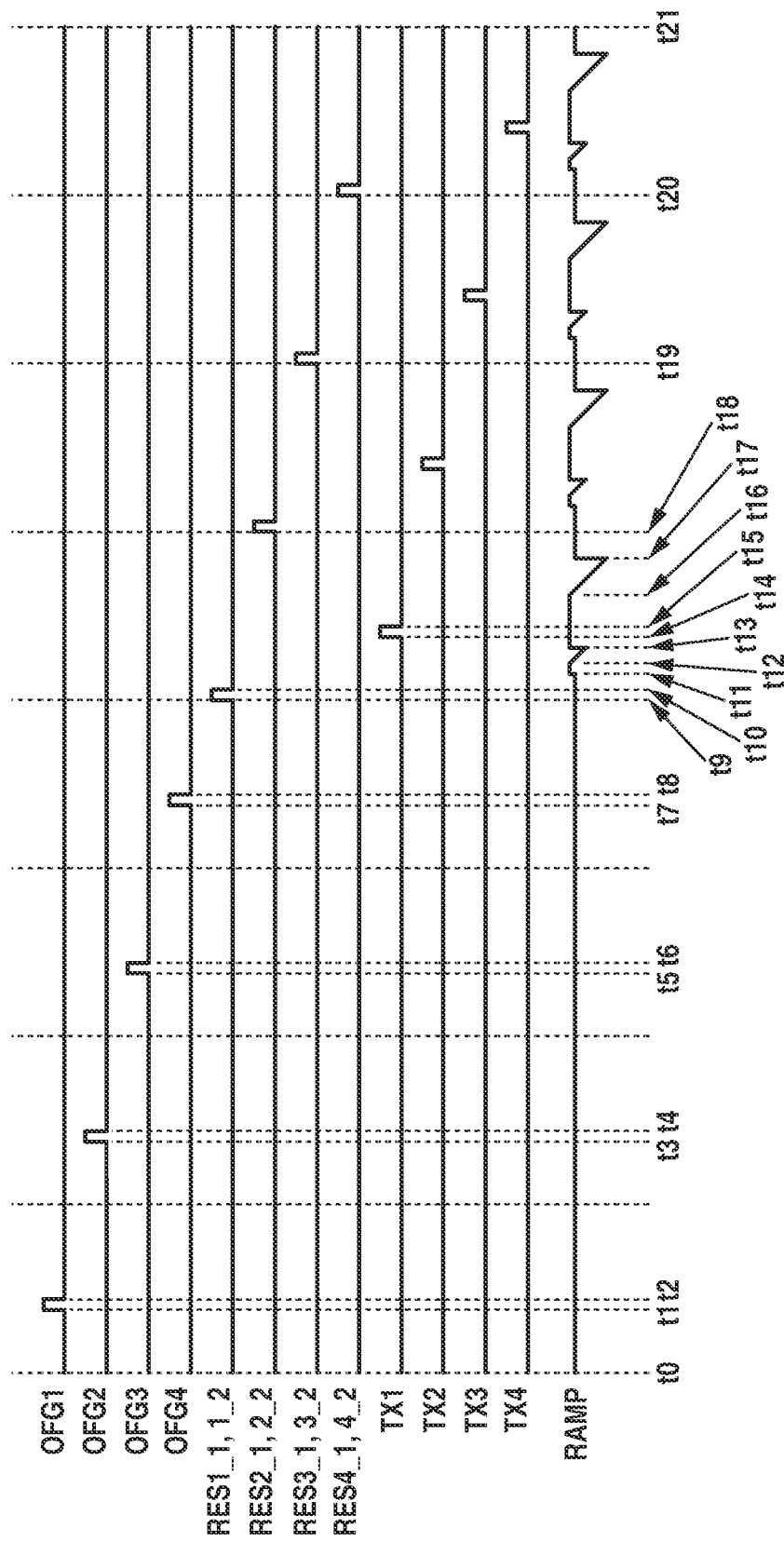
FIG. 4 is a timing chart illustrating an operation of the imaging device according to the first exemplary embodiment.

FIG. 4 is a timing chart illustrating an operation of the imaging device illustrated in FIG. 3. Signals illustrated in FIG. 2 correspond to the signals illustrated in FIG. 2 and FIG. 3. The operation illustrated in FIG. 4 is a rolling shutter operation, in which the start of an electric charge accumulation period for the pixels 100 is sequentially performed in each row.

The vertical scanning circuit 110 sets the signal OFG1 at high level at time t1 and then sets the signal OFG1 at low level. This causes the photoelectric conversion portions 130 of the pixels 100 in the first row to start accumulation of electric charges that are based on incident light at time t2.

After that, similarly, the vertical scanning circuit 110 sequentially performs an operation to set the signal OFGn at high level and then set the signal OFGn at low level in each row.

The vertical scanning circuit 110 sets the signals RES1_1 and RES1_2 at high level at time t9 and then sets the signals RES1_1 and RES1_2 at low level. This causes the electric charges of the floating diffusion portion 145 to be reset.

The ramp signal generation unit (not illustrated) starts variation of the electric potential of the ramp signal RAMP at time t12. Moreover, a counter circuit (not illustrated) starts counting of a clock signal at time t12.

After that, when the magnitude relationship between the electric potential of the input node of the input transistor 170 and the electric potential of the input node of the input transistor 160 is reversed, the signal level of the signal Cout changes. In response to such a change of the signal level of the signal Cout, the memory portion 40 retains a count signal corresponding to timing at which the signal level of the signal Cout has changed. This results in obtaining a digital signal that is based on the electric potential of the floating diffusion portion 145 resetting of which has been canceled. This digital signal is referred to as "noise data". The noise data has a noise component which principally involves an operation variation for each AD conversion portion.

Furthermore, a change of the signal level of the signal Cout brings about a kickback noise which is transmitted to the control line used for transferring the signal RES1_1 via a parasitic capacitance between the main node of the transistor 150 and the input node of the transistor 150.

Suppose that the transistors 150 of the pixels 100 in all of the columns arranged in one row are connected to one control line used for transferring the signal RES. In this case, a kickback noise caused by a change of the signal level of the signal Cout generated at a differential stage 25 is transmitted to the input nodes of the transistors 150 of the pixels 100 in all of the columns arranged in one row. Such a variation of the electric potential of the input node of the transistor 150 varies the electric potential of the floating diffusion portion 145 via a parasitic capacitance between the input node of the transistor 150 and the main node of the transistor 150. As a result, in the differential stage 25, which has been affected by the kickback noise, the signal level of the signal Cout changes at timing that is different from timing at which it originally changes. Accordingly, the AD conversion accuracy of the differential stage 25 affected by a kickback noise decreases.

On the other hand, in the imaging device according to the first exemplary embodiment, as illustrated in FIG. 3, the input nodes of the transistors 150 of pixels 100 in some columns of a plurality of columns in one row are connected to a control line used for transferring the signal RES1_1. Then, the input nodes of the transistors 150 of pixels 100 in the other columns of the plurality of columns are connected to a control line used for transferring the signal RES1_2, which is a control line different from the control line used for transferring the signal RES1_1. Accordingly, the kickback noise generated in the signal RES1_1 is unlikely to be transferred to the pixels 100 having the transistors 150 connected to the signal RES1_2. Therefore, the imaging device according to the first exemplary embodiment is able to prevent or reduce a decrease in AD conversion accuracy caused by a kickback noise.

In the imaging device according to the first exemplary embodiment, the transistor 150 is a connection portion which connects the input node of the input transistor 160 and a predetermined node. The predetermined node referred to in the first exemplary embodiment is a node which connects the main node of the input transistor 160 and the current mirror circuit portion 30. The photoelectric conversion portion 130, the floating diffusion portion 145, the differential stage 25, and the transistor 150 (connection portion) are assumed to be a set. In this case, it can be said that a plurality of sets is arranged over a plurality of columns in one row. With respect to a plurality of sets arranged in a plurality of columns in one row, the control line used for transferring the signal RES1_1 and the control line used for transferring the signal RES1_2 are arranged as a plurality of control lines. Then, the control line used for transferring the signal RES1_1 is connected to connection portions (transistors 150) of some sets of the plurality of sets. Then, the control line used for transferring the signal RES1_2 is connected to connection portions (transistors 150) of the other sets of the plurality of sets.

Next, the vertical scanning circuit 110 sets the signal TX1 at high level at time t14 and then sets signal TX1 at low level. With this, electric charges accumulated by the photoelectric conversion portion 130 during a period from time t2 to time t15 are transferred from the photoelectric conversion portion 130 to the floating diffusion portion 145 via the transistor 140. With this, the floating diffusion portion 145 becomes at an electric potential corresponding to the electric charges which the photoelectric conversion portion 130 has accumulated based on incident light.

After that, the ramp signal generation unit (not illustrated) starts variation of the electric potential of the ramp signal RAMP at time t16. Moreover, the counter circuit (not illustrated) starts counting of a clock signal at time t16.

After that, when the magnitude relationship between the electric potential of the input node of the input transistor 170 and the electric potential of the input node of the input transistor 160 is reversed, the signal level of the signal Cout changes. In response to such a change of the signal level of the signal Cout, the memory portion 40 retains a count signal corresponding to timing at which the signal level of the signal Cout has changed. This results in obtaining a digital signal that is based on the electric charges which the photoelectric conversion portion 130 has accumulated based on incident light. This digital signal is referred to as "light data".

Even when this light data is generated, a kickback noise occurs as with the time of generation of the above-mentioned noise data. However, in the imaging device according to the first exemplary embodiment, as illustrated in FIG. 3, the input nodes of the transistors 150 of pixels 100 in some columns of a plurality of columns in one row are connected to a control line used for transferring the signal RES1_1. Then, the input nodes of the transistors 150 of pixels 100 in the other columns of the plurality of columns are connected to a control line used for transferring the signal RES1_2, which is a control line different from the control line used for transferring the signal RES1_1. Accordingly, the kickback noise generated in the signal RES1_1 is unlikely to be transferred to the pixels 100 having the transistors 150 connected to the signal RES1_2. Therefore, the imaging device according to the first exemplary embodiment is able to prevent or reduce a decrease in AD conversion accuracy caused by a kickback noise.

Subsequently, with respect to the pixels 100 in the next row, operations for obtaining noise data and light data are performed in a similar way for each row.

As described above, in the imaging device according to the first exemplary embodiment, with respect to a plurality of sets arranged in a plurality of columns in one row, a control line used for transferring the signal RES1_1 and a control line used for transferring the signal RES1_2 are arranged as a plurality of control lines. Then, the control line used for transferring the signal RES1_1 is connected to connection portions (transistors 150) of some sets of the plurality of sets. Then, the control line used for transferring the signal RES1_2 is connected to connection portions (transistors 150) of the other sets of the plurality of sets. This enables preventing or reducing a kickback noise caused by a change of the comparison result signal (signal Cout) output from the differential stage 25 of a set from being transmitted to the differential stage 25 of another set. With this, the imaging device according to the first exemplary embodiment has an advantageous effect of preventing or reducing a decrease in AD conversion accuracy caused by the kickback noise.

Moreover, suppose that the signal levels of the comparison result signals (signals Cout) output from the differential stages 25 in a plurality of columns have changed at the same time. In the first exemplary embodiment, the control line used for transferring the signal RES1_1 and the control line used for transferring the signal RES1_2 are provided. Therefore, the number of differential stages 25 connected to one control line is less than in a case where the differential stages 25 in all of the plurality of columns in one row are connected to one control line used for transferring the signal RES. In the first exemplary embodiment, the number of differential stages 25 connected to one control line becomes ½ as compared with a case where the differential stages 25 in all of the plurality of columns in one row are connected to one control line used for transferring the signal RES. Therefore, a kickback noise which is transmitted to a control line used for transferring the signal RES1_1 becomes a kickback noise output from the differential stages 25 in columns of ½ of the plurality of columns in one row. A kickback noise which is transmitted to a control line used for transferring the signal RES1_2 also becomes a kickback noise output from the differential stages 25 in columns of ½ of the plurality of columns in one row. In this way, a kickback noise which is transmitted to each of the control lines used for transferring the signal RES1_1 and the control lines used for transferring the signal RES1_2 becomes smaller than in a case where the differential stages 25 in all of the plurality of columns in one row are connected to single control line for transferring the signal RES.

Furthermore, in the first exemplary embodiment, an imaging device in which the vertical scanning circuit 110 is provided in the second chip 2 has been described as an example. The first exemplary embodiment is not limited to this example, but the vertical scanning circuit 110 can be provided in the first chip 1.

In the first exemplary embodiment, an imaging device in which a stacked-type imaging device in which the first chip 1 and the second chip 2 are stacked in layers has been described as an example. The first exemplary embodiment is not limited to this example. For example, an imaging device in which the pixels 100 and the signal processing circuits 105 are provided in one chip can be employed. Even in this case, as described in the first exemplary embodiment, with respect to a plurality of sets arranged in a plurality of columns in one row, a control line used for transferring the signal RES1_1 and a control line used for transferring the signal RES1_2 are arranged as a plurality of control lines. Then, the control line used for transferring the signal RES1_1 is connected to connection portions (transistors 150) of some sets of the plurality of sets. Then, the control line used for transferring the signal RES1_2 can be connected to connection portions (transistors 150) of the other sets of the plurality of sets.

Furthermore, in the imaging device according to the first exemplary embodiment, an example in which each control line of the vertical scanning circuit 110 is connected to a plurality of columns in a single, common row has been described. As another example, each control line of the vertical scanning circuit 110 can be connected to a plurality of rows of a single column. In this case, with respect to a plurality of sets arranged in a plurality of rows of one column, a control line used for transferring the signal RES1_1 and a control line used for transferring the signal RES1_2 are arranged as a plurality of control lines. Then, the control line used for transferring the signal RES1_1 is connected to connection portions (transistors 150) of some sets of the plurality of sets. Then, the control line used for transferring the signal RES1_2 can be connected to connection portions (transistors 150) of the other sets of the plurality of sets.

An imaging device according to a second exemplary embodiment is described with a focus on differences from those in the first exemplary embodiment.

The imaging device according to the above first exemplary embodiment performs a rolling shutter operation. The imaging device according to the second exemplary embodiment performs a global shutter operation, in which starting points and ending points of electric charge accumulation periods of pixels 100 in a plurality of columns in a plurality of rows are made uniform with each other.

The configuration of the imaging device according to the second exemplary embodiment can be set to be the same as in the first exemplary embodiment.

Figure 5:
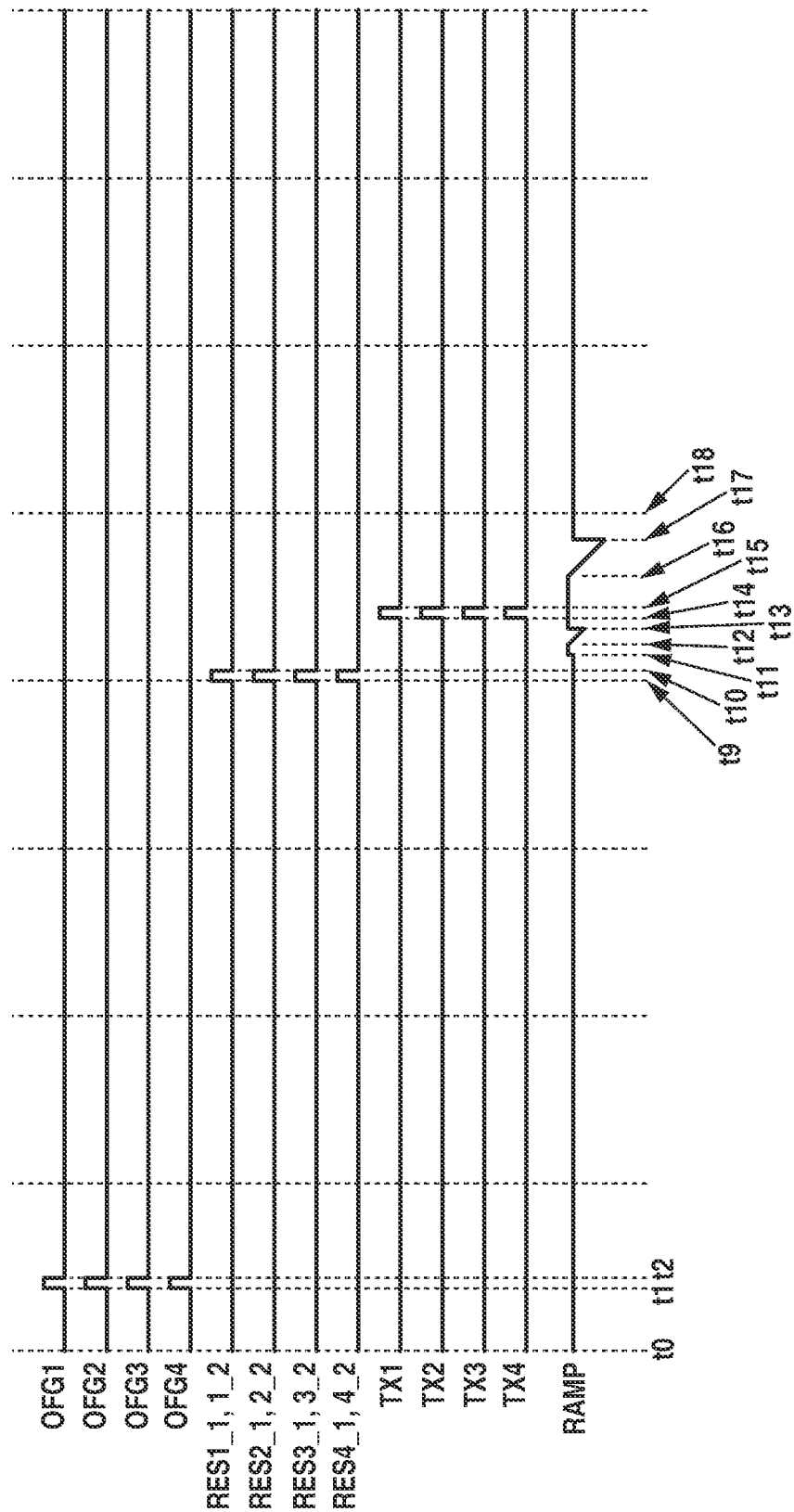
FIG. 5 is a timing chart illustrating an operation of an imaging device according to a second exemplary embodiment.

FIG. 5 is a timing chart illustrating an operation of the imaging device according to the second exemplary embodiment.

The vertical scanning circuit 110 sets signals OFG1 to OFG4, which are supplied to pixels 100 in a plurality of columns in a plurality of rows, at high level at time t1 and then sets the signals OFG1 to OFG4 at low level. This causes the photoelectric conversion portions 130 of the pixels 100 in the plurality of columns in the plurality of rows to collectively start accumulation of electric charges that are based on incident light at time t2.

At time t9, the vertical scanning circuit 110 sets signals RES1_1 to RES4_1 and RES1_2 to RES4_2, which are supplied to the pixels 100 in the plurality of columns in the plurality of rows, at high level and then sets those signals at low level. This performs resetting of electric charges of the floating diffusion portions 145 of the pixels 100 in the plurality of columns in the plurality of rows.

After that, the differential stage 25 and the memory portion 40, which serve as an AD conversion portion, perform AD conversion for obtaining noise data in the same manner as that in the imaging device of the first exemplary embodiment. In the above first exemplary embodiment, during a period in which the AD conversion portions of the pixels 100 in a row are performing AD conversion, the AD conversion portions of the pixels 100 in another row are not performing AD conversion. In the second exemplary embodiment, the AD conversion portions of the pixels 100 in the plurality of columns in the plurality of rows perform AD conversion in parallel. Typically, starting points and ending points of AD conversion performed by the AD conversion portions of the pixels 100 in the plurality of columns in the plurality of rows are with the same as each other. Furthermore, in the context of the present specification, the starting point of AD conversion is timing at which the ramp signal generation unit (not illustrated) starts changing of the electric potential of a ramp signal. Moreover, the ending point of AD conversion is timing at which the ramp signal generation unit (not illustrated) ends changing of the electric potential of a ramp signal.

Even in the second exemplary embodiment, similarly to the first exemplary embodiment, with respect to a plurality of sets arranged in a plurality of columns of one row, a control line used for transferring the signal RES1_1 and a control line used for transferring the signal RES1_2 are arranged as a plurality of control lines. Then, the control line used for transferring the signal RES1_1 is connected to connection portions (transistors 150) of some sets of the plurality of sets. Then, the control line used for transferring the signal RES1_2 is connected to connection portions (transistors 150) of the other sets of the plurality of sets. This enables preventing or reducing a kickback noise caused by a change of the comparison result signal (signal Cout) output from the differential stage 25 of a set from being transmitted to the differential stage 25 of another set. With this, the imaging device according to the second exemplary embodiment has an advantageous effect of preventing or reducing a decrease in AD conversion accuracy caused by the kickback noise.

An imaging device according to a third exemplary embodiment is described with a focus on differences from those in the first exemplary embodiment.

Figure 6:
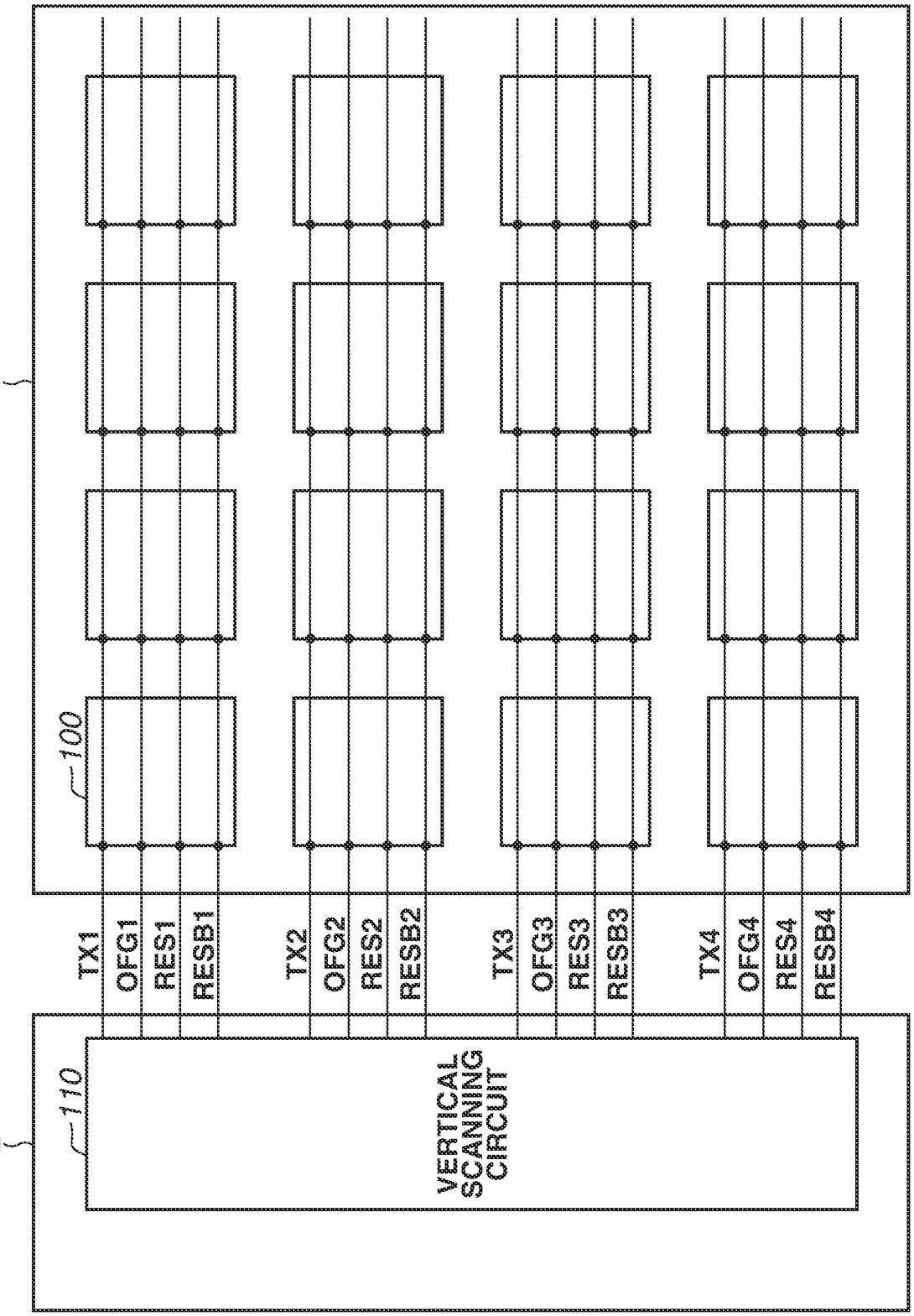
FIG. 6 is a circuit diagram of an imaging device according to a third exemplary embodiment.

FIG. 6 is a diagram illustrating a configuration of an imaging device according to the third exemplary embodiment. The imaging device according to the third exemplary embodiment outputs a signal RESn and a signal RESBn to pixels 100 in a plurality of columns of one row. Then, the pixels 100 in the plurality of columns are connected to a control line used for transferring the signal RESn in common. Moreover, the pixels 100 in the plurality of columns are connected to a control line used for transferring the signal RESBn in common.

Figure 7:
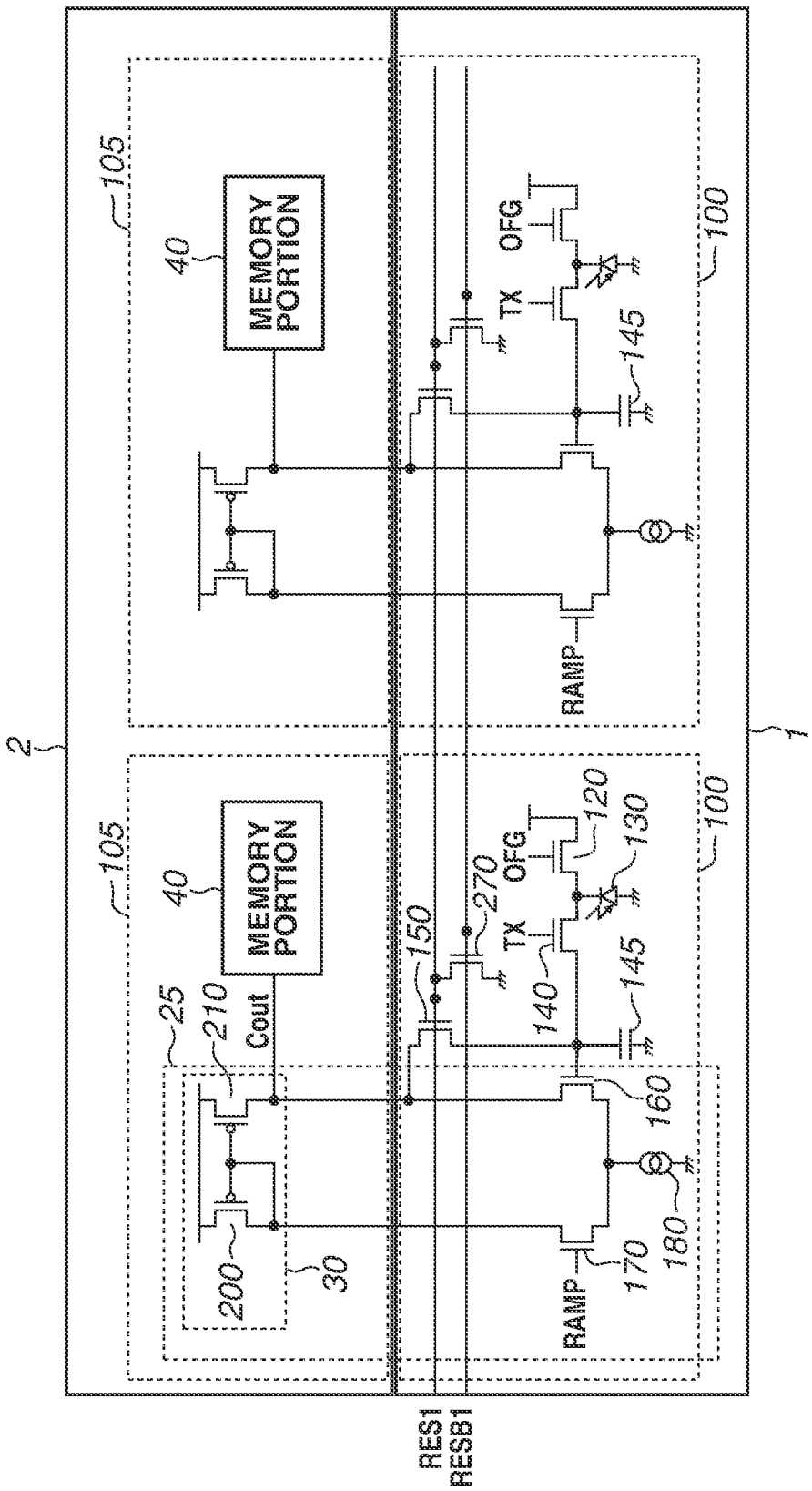
FIG. 7 is a circuit diagram of the imaging device according to the third exemplary embodiment.

FIG. 7 is a circuit diagram illustrating circuits of pixels 100 and signal processing circuits 105 in the imaging device illustrated in FIG. 6.

The pixel 100 in the third exemplary embodiment includes a transistor 270. One main node of the transistor 270 is connected to the control line used for transferring the signal RESn, and the other main node of the transistor 270 is connected to a node of the ground potential, which is a predetermined electric potential. The control line used for transferring the signal RESBn is connected to the input node of the transistor 270.

The imaging device according to the third exemplary embodiment includes a transistor 150, which serves as a first transistor, having a node connected to the main node of the input transistor 160 and the current mirror circuit portion 30 and a node connected to the input node of the input transistor 160. Additionally, the imaging device according to the third exemplary embodiment includes the transistor 270, which serves as a second transistor, connected to the transistor 150 serving as the first transistor. The transistor 270 is a transistor which connects the input node of the transistor 150 serving as the first transistor and a node of the ground potential, which is a predetermined node.

The signal RESBn is a signal opposite in phase to the signal RESn. More specifically, when the signal RESn is at high level, the signal RESBn is at low level. When the signal RESn is at low level, the signal RESBn is at high level.

The operation of the imaging device according to the third exemplary embodiment can be set to be the rolling shutter operation illustrated in FIG. 4 or the global shutter operation illustrated in FIG. 5. As mentioned above, the signal RESBn is a signal opposite in phase to the signal RESn.

During a period in which the AD conversion portion is performing AD conversion (the electric potential of the ramp signal is changing monotonously), the signal RESn is at low level. Furthermore, this low level is assumed to be the ground potential in the third exemplary embodiment. In a case where the signal RESn is at low level, the signal RESBn is at high level. Therefore, the control line used for transferring the signal RESn is connected to the node of the ground potential via the transistor 270 of each pixel 100. With this, in the control line used for transferring the signal RESn, an impedance to the node of the ground potential becomes small. Accordingly, even if a kickback noise caused by a change in signal level of the signal Cout output from a differential stage 25 is superposed on the control line used for transferring the signal RESn via the transistor 150, a variation of the electric potential of the control line caused by the kickback noise is prevented or reduced. Then, the electric potential of the control line can be statically set to the ground potential in a rapid manner Therefore, it is possible to prevent or reduce a kickback noise caused by a change in signal level of the signal Cout output from a differential stage 25 from being transmitted to another differential stage 25.

An imaging device according to a fourth exemplary embodiment is described with a focus on differences from those in the third exemplary embodiment.

Figure 8:
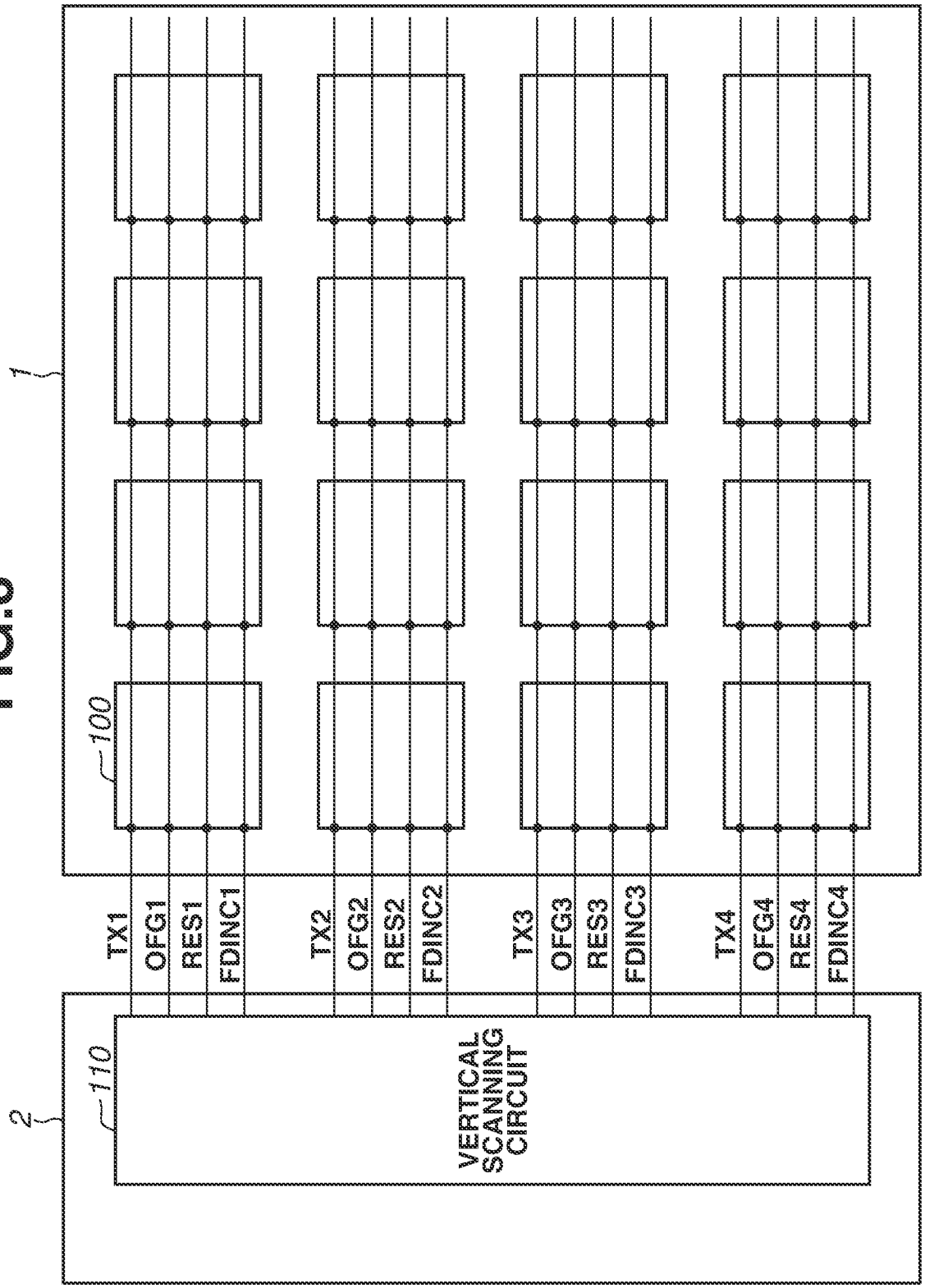
FIG. 8 is a circuit diagram of an imaging device according to a fourth exemplary embodiment.

FIG. 8 is a diagram illustrating a configuration of an imaging device according to the fourth exemplary embodiment. The vertical scanning circuit 110 in the fourth exemplary embodiment outputs a signal FDINCn to the pixels 100.

Figure 9:
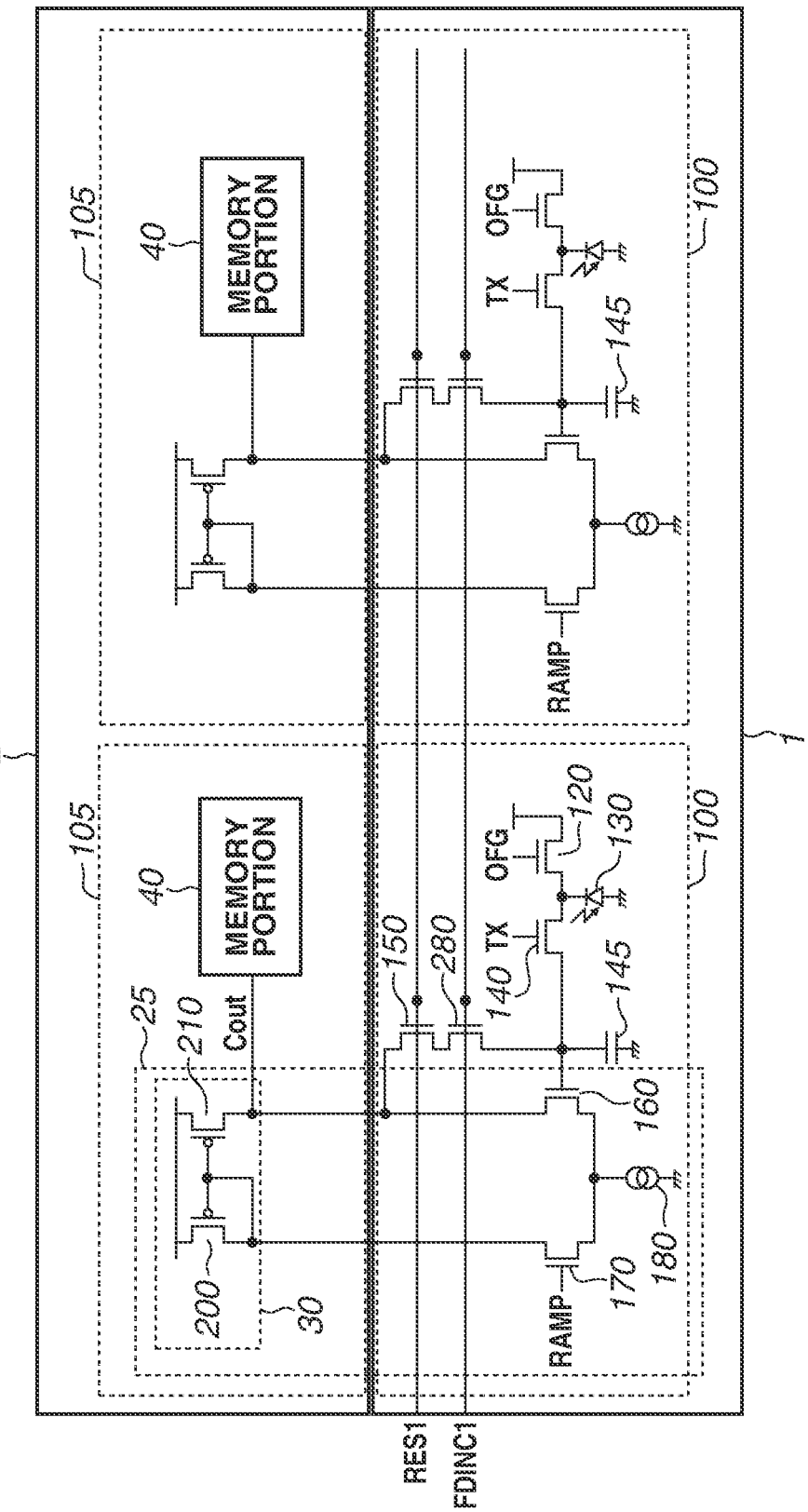
FIG. 9 is a circuit diagram of the imaging device according to the fourth exemplary embodiment.

FIG. 9 is a circuit diagram illustrating circuits of pixels 100 and signal processing circuits 105 in the imaging device illustrated in FIG. 8.

The imaging device according to the fourth exemplary embodiment has a configuration which switches a capacitance connected to the input node of the input transistor 160 between the capacitance of the floating diffusion portion 145 and a composite capacitance composed of the capacitance of the floating diffusion portion 145 and an additional capacitance.

The control line used for transferring the signal FDINCn is connected to a transistor 280. When the signal FDINCn is at high level, the transistor 280 is turned on. In this case, electric charges accumulated by the photoelectric conversion portion 130 are transferred to the floating diffusion portion 145 and an inversion layer is formed below the input node of the transistor 280. Thus, the inversion layer formed below the input node of the transistor 280 causes an increase in the capacitance value of the capacitance connected to the input node of the input transistor 160. Accordingly, it can be said that the transistor 280 is an additional capacitance connected to the input node of the input transistor 160.

To perform resetting of the floating diffusion portion 145, both the signal RESn and the signal FDINCn are set at high level.

The signal level of the signal FDINCn is able to be changed, for example, in each frame or in each row. The "frame" here corresponds to one image generated using a signal from the imaging device. Typically, a period from a time when the vertical scanning circuit 110 selects a predetermined row to a time when the vertical scanning circuit 110 re-selects the predetermined row is a period corresponding to one frame. In a case where changing is performed in each frame, a result of image capturing in a frame can be used as a basis to determine the signal level of the signal FDINCn in the next frame. More specifically, in a frame, image capturing is performed with the signal FDINCn set at low level. In a case where, as a result of such image capturing, it has been detected that the floating diffusion portion 145 has accumulated the amount of electric charge which reaches saturation or is close to saturation, in the next frame, the signal FDINCn is set at high level. Conversely, when the signal TXn is set at high level in a frame, image capturing can be performed with the signal FDINCn set at high level. In this case, in a case where, as a result of image capturing, the signal level of light data falls below a threshold value, in the next frame, the signal FDINCn is set at low level when the signal TXn is set at high level. This operation can be performed not only in the case of the rolling shutter operation illustrated in FIG. 4 but also in the case of the global shutter operation illustrated in FIG. 5.

Moreover, in a case where the signal level of the signal FDINCn is changed in each row, the rolling shutter operation illustrated in FIG. 4 is preferable. This operation refers to a signal of light data in a pixel row from which acquisition of light data is performed prior to transition of the signal RES for the pixels 100 in the n-th row from high level to low level. In a case where this light data is larger than a predetermined threshold value, the signal FDINCn for the pixels 100 in the n-th row is kept at high level even after the signal RESn transitions from high level to low level.

In a case where the signal FDINCn is set at low level, the transistor 280 has an effect of preventing or reducing a kickback noise output from a differential stage 25 from being transmitted to another differential stage 25. Suppose that a kickback noise output from a differential stage 25 is transmitted to a control line used for transferring the signal RESn. However, since the transistor 280 is provided in an electrical pathway between the transistor 150 and the floating diffusion portion 145, a variation of the electric potential of the control line used for transferring the signal RESn is unlikely to be transmitted to the floating diffusion portion 145. Therefore, in a case where the signal FDINCn is set at low level, the transistor 280 has an effect of preventing or reducing a kickback noise output from a differential stage 25 from being transmitted to another differential stage 25.

Moreover, in a case where the signal FDINCn is set at low level, an operation for reading out electric charges of the photoelectric conversion portion 130 is performed with the capacitance of the input node of the input transistor 160 set smaller (in other words, to higher sensitivity) than in a case where the signal FDINCn is at high level. In this case, when the kickback noise is transmitted to the floating diffusion portion 145, an electric potential variation caused by the noise also becomes larger than in a case where the signal FDINCn is at high level. Therefore, this decreases the signal-to-noise (S/N) ratio of light data. The imaging device according to the fourth exemplary embodiment has an advantageous effect of, in such a higher sensitivity state, preventing or reducing a kickback noise from being transmitted to the floating diffusion portion 145. With this, the imaging device according to the fourth exemplary embodiment is able to improve the S/N ratio of light data in the higher sensitivity state, so that a higher-sensitivity imaging device can be attained.

The imaging device according to the fourth exemplary embodiment includes a transistor 150, which serves as a first transistor, having a node connected to the main node of the input transistor 160 and the current mirror circuit portion 30 and a node connected to the input node of the input transistor 160. Additionally, the imaging device according to the fourth exemplary embodiment includes the transistor 280, which serves as a second transistor, connected to the transistor 150 serving as the first transistor. The transistor 280 is a transistor which connects the input node of the transistor 150 serving as the first transistor and the floating diffusion portion 145, which is a predetermined node.

Furthermore, an example of the additional capacitance is not limited to the example illustrated in FIG. 9.

Figure 10:
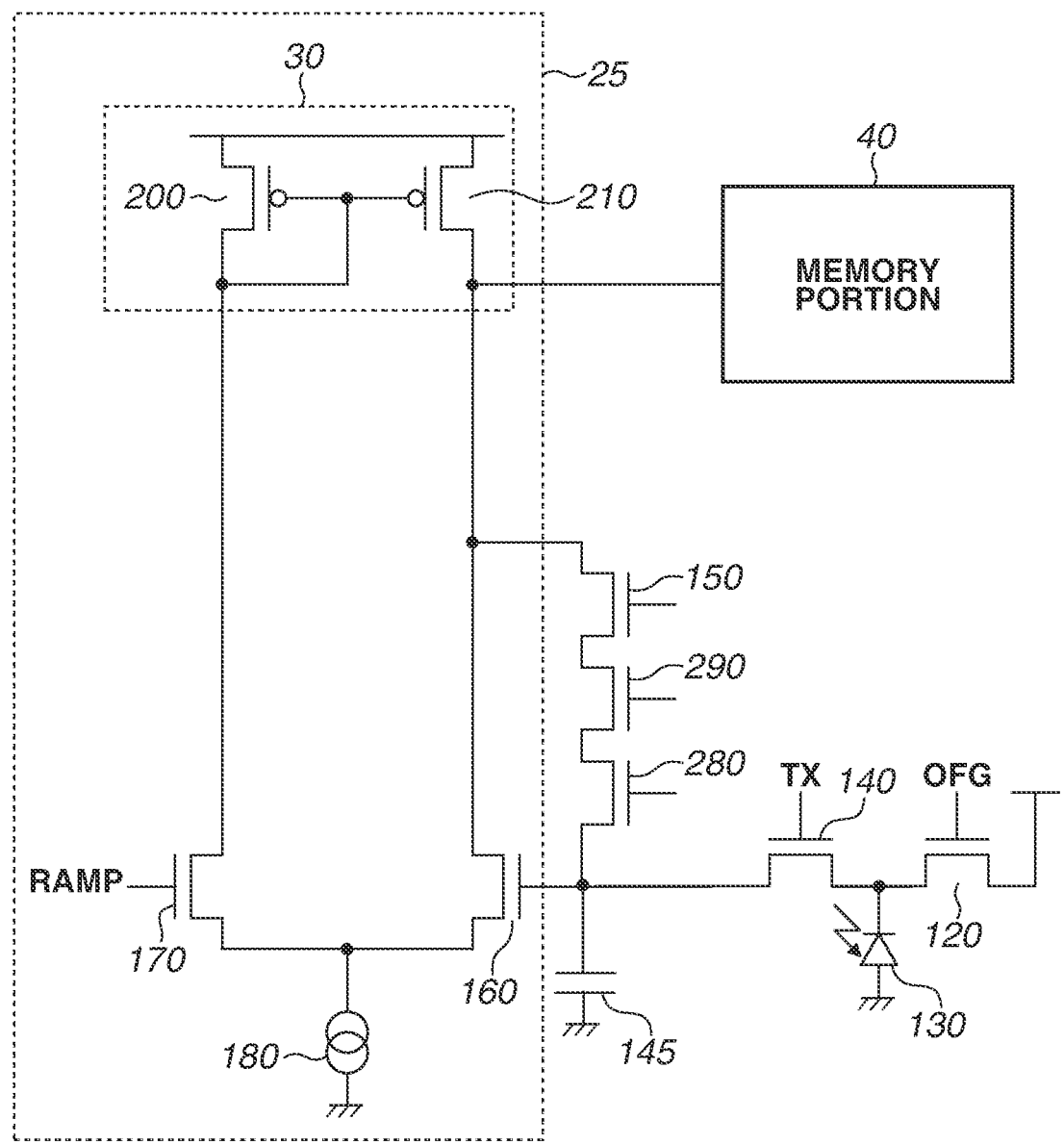
FIG. 10 is a circuit diagram of the imaging device according to the fourth exemplary embodiment.

As another example, as illustrated in FIG. 10, a transistor 290 connected in series to the transistor 280 and the transistor 150 can be provided. In this case, the capacitance value connected to the input node of the input transistor 160 can be set to three types. Specifically, the three types include (1) the floating diffusion portion 145, (2) the floating diffusion portion 145+the transistor 280, and (3) the floating diffusion portion 145+the transistor 280+the transistor 290.

Figure 11:
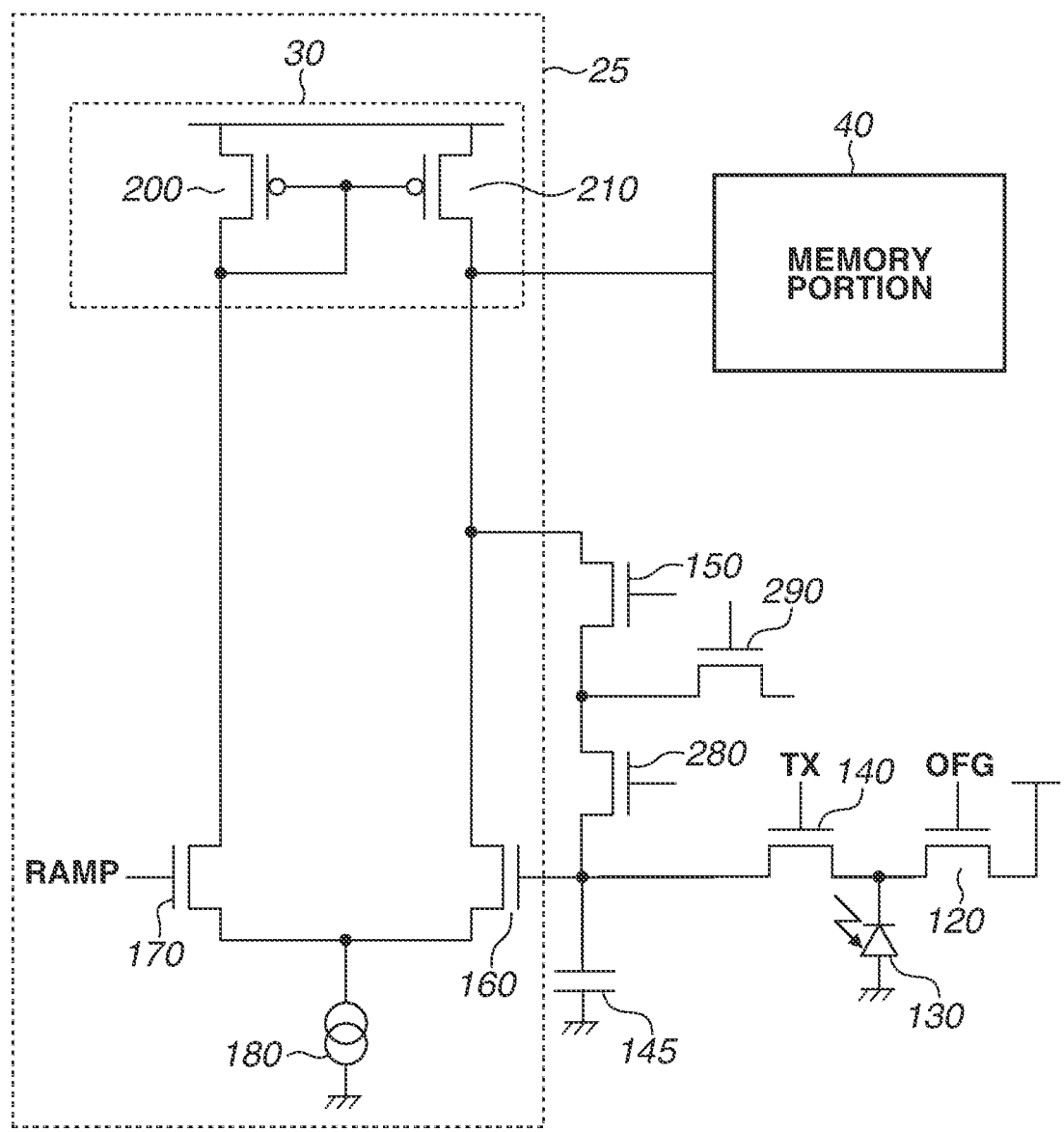
FIG. 11 is a circuit diagram of the imaging device according to the fourth exemplary embodiment.

Moreover, as another example, as illustrated in FIG. 11, a transistor 290 connected to the transistor 150 in parallel with the transistor 280 can be provided. In this case, the capacitance value connected to the input node of the input transistor 160 can be set to three types. Specifically, the three types include (1) the floating diffusion portion 145, (2) the floating diffusion portion 145+the transistor 280, and (3) the floating diffusion portion 145+the transistor 280+the transistor 290.

An imaging device according to a fifth exemplary embodiment is described with a focus on differences from those in the fourth exemplary embodiment.

In the above fourth exemplary embodiment, the transistor 280, which is an additional capacitance, is provided in an electrical pathway between the transistor 150 and the floating diffusion portion 145. In the imaging device according to the fifth exemplary embodiment, the transistor 280 is connected to the floating diffusion portion 145 in parallel with the transistor 150.

Figure 12:
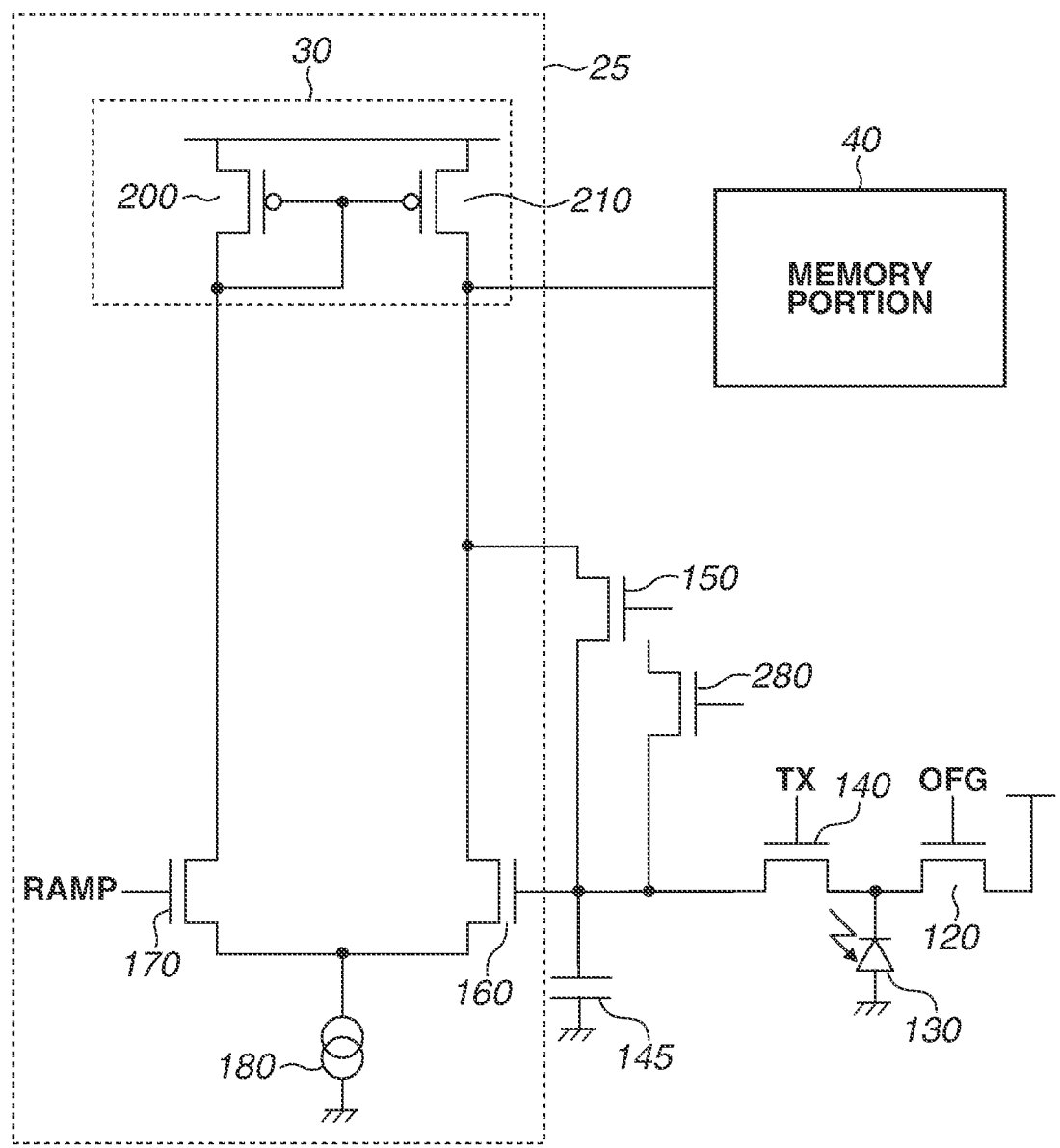
FIG. 12 is a circuit diagram of an imaging device according to a fifth exemplary embodiment.

FIG. 12 is a circuit diagram illustrating circuits of the imaging device according to the fifth exemplary embodiment. The operation of the imaging device can be configured to be the same as in the fourth exemplary embodiment.

In the fifth exemplary embodiment, reducing a kickback noise output from the differential stage 25 can be performed by setting the signal FDINCn at high level. More specifically, the capacitance of the transistor 280 is added to the floating diffusion portion 145 as a capacitance connected to the input node of the input transistor 160. Suppose that a kickback noise output from the differential stage 25 is transmitted to the floating diffusion portion 145 via one of or both the transistor 160 and the transistor 150. In a case where the signal FDINCn is at high level, the capacitance of the input node of the input transistor 160 has become larger as the transistor 280 is connected to the input node of the input transistor 160. Therefore, a variation of the electric potential of the input node of the input transistor 160 can be prevented or reduced. With this, the imaging device according to the fifth exemplary embodiment has an advantageous effect of preventing or reducing a decrease in AD conversion accuracy caused by the kickback noise.

Figure 13:
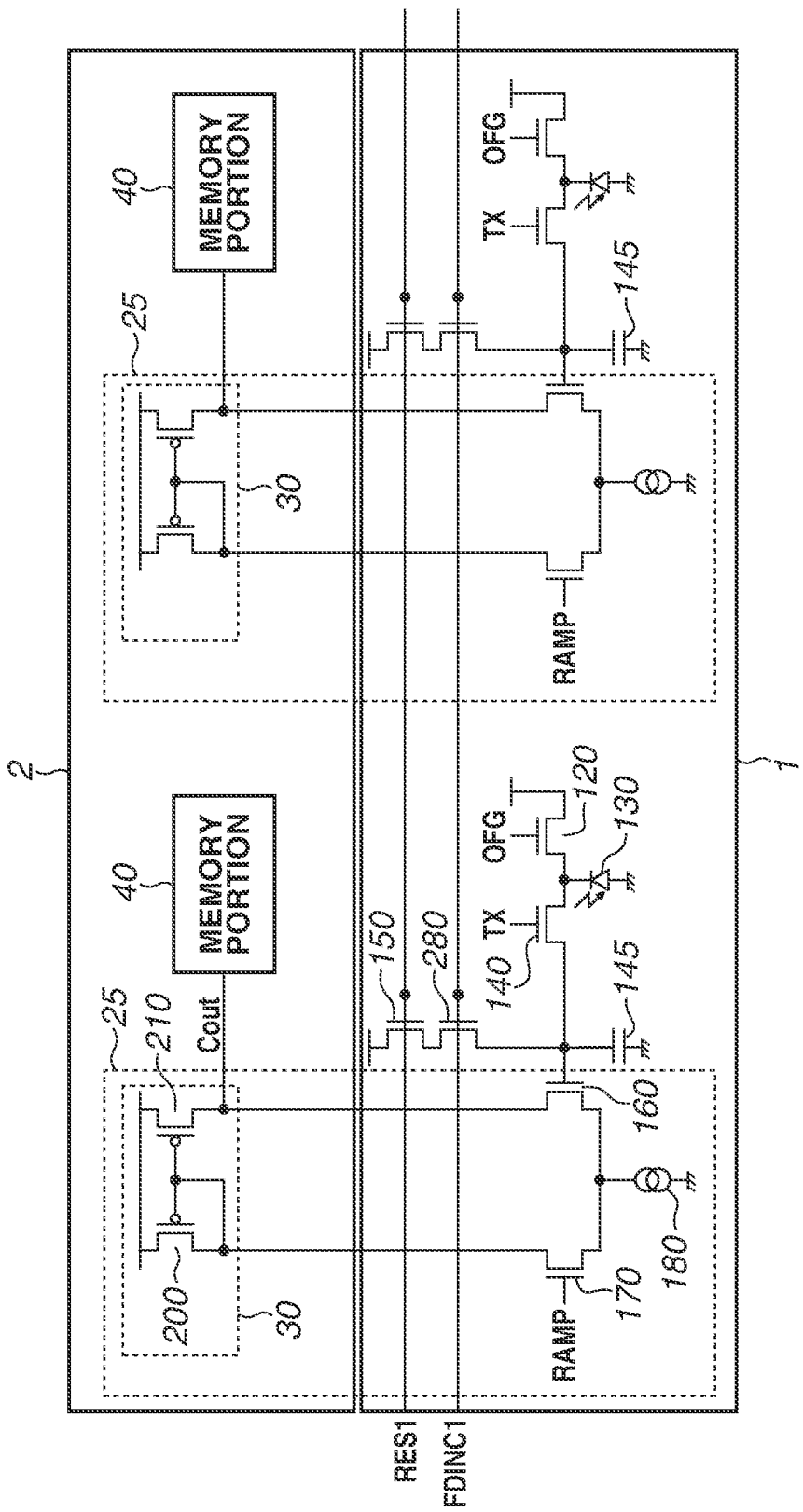
FIG. 13 is a circuit diagram of the imaging device according to the fifth exemplary embodiment.

Furthermore, the form of the additional capacitance in the fifth exemplary embodiment is not limited to the example illustrated in FIG. 12. For example, as illustrated in FIG. 13, the transistor 280 can be provided in an electrical pathway between the transistor 150 and the floating diffusion portion 145. Even in this example, the same advantageous effect as that in the imaging device according to the fifth exemplary embodiment can be attained.

An imaging device according to a sixth exemplary embodiment is described with a focus on differences from those in the first exemplary embodiment.

In the imaging device according to the above first exemplary embodiment, some sets of a plurality of sets are connected to a control line used for transferring a signal RESn_1 and the other sets of the plurality of sets are connected to a control line used for transferring a signal RESn_2. In the imaging device according to the sixth exemplary embodiment, some sets of a plurality of sets are connected to a control line used for transferring a signal TXn_1 and the other sets of the plurality of sets are connected to a control line used for transferring the signal TXn_2.

Figure 14:
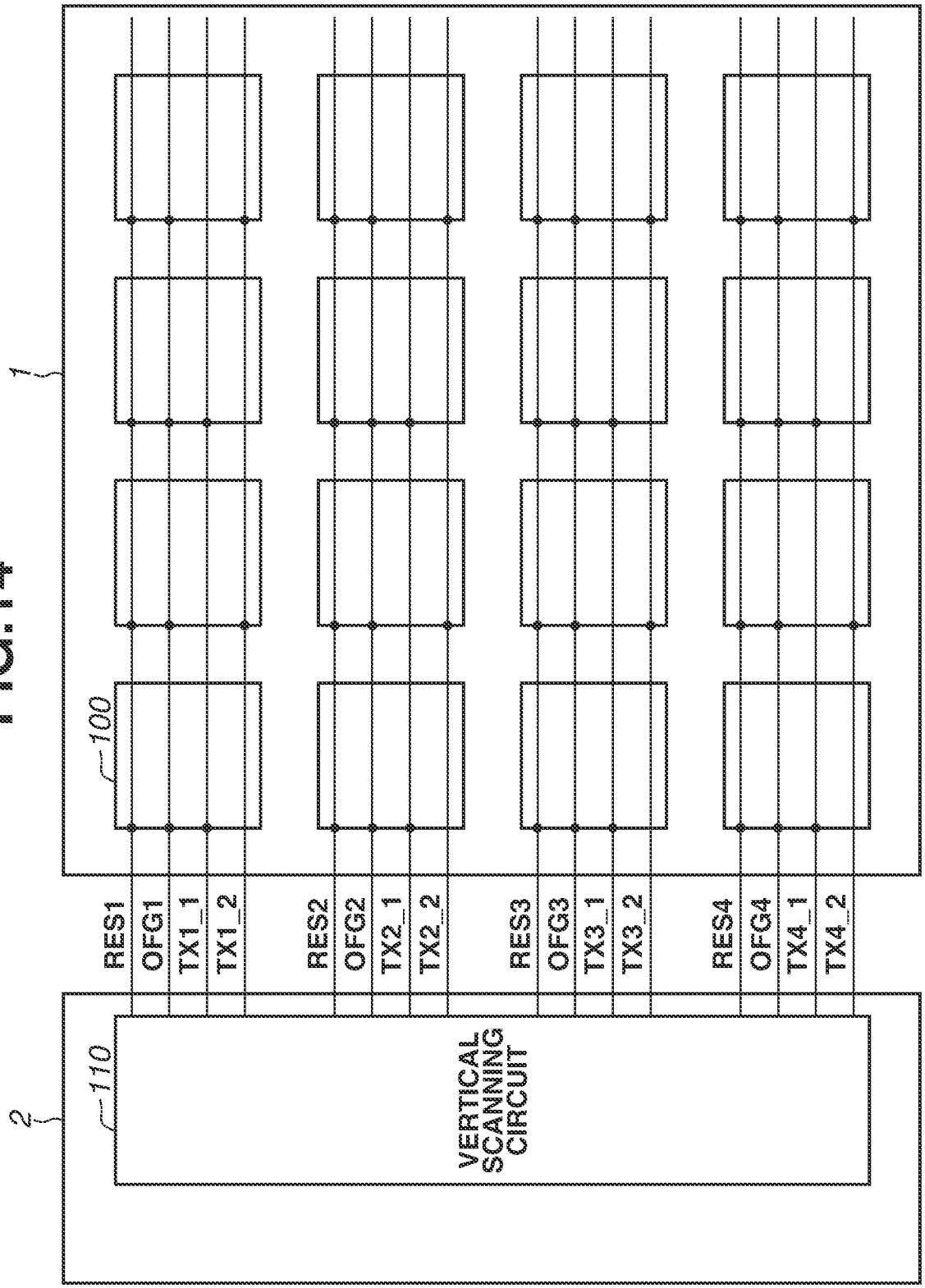
FIG. 14 is a circuit diagram of an imaging device according to a sixth exemplary embodiment.

FIG. 14 is a block diagram illustrating a configuration of the imaging device according to the sixth exemplary embodiment. Each of the signal TXn_1 and the signal TXn_2 is arranged over a plurality of columns in one row. A control line used for transferring the signal TXn_1 is connected to some pixels 100 and a control line used for transferring the signal TXn_2 is connected to the other pixels 100.

Figure 15:
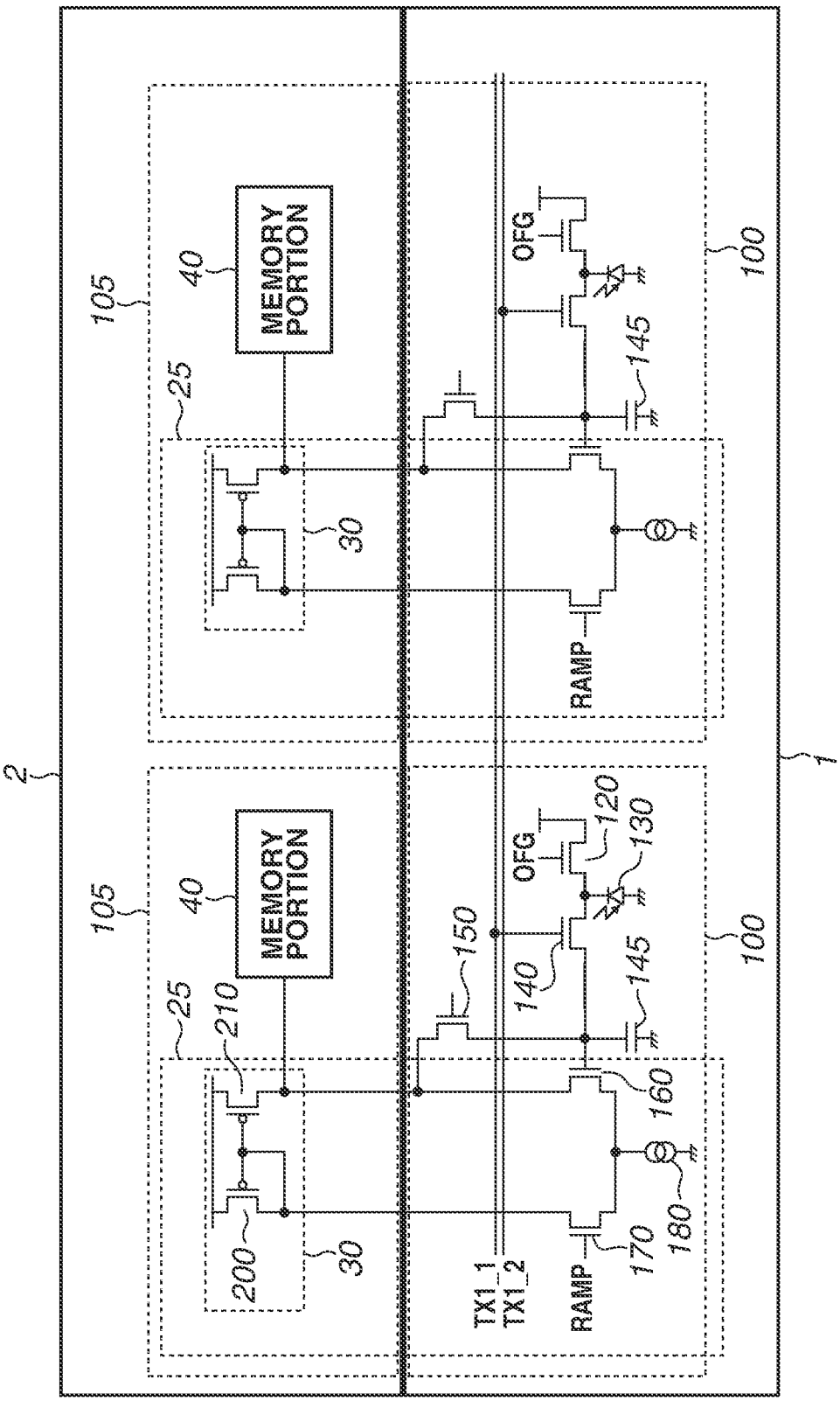
FIG. 15 is a circuit diagram of the imaging device according to the sixth exemplary embodiment.

FIG. 15 is a circuit diagram illustrating circuits of the imaging device according to the sixth exemplary embodiment.

The signal TX1_1 is connected to the transistor 140 included in some sets. The signal TX1_2 is connected to the transistor 140 included in the other sets.

In a case where the transistors 140 included in sets in a plurality of columns in one row are connected to one control line used for transferring a signal TXn, a kickback noise generated at a differential stage 25 is transmitted to the control line used for transferring the signal TXn via the transistor 150, the floating diffusion portion 145, and the transistor 140. The kickback noise transmitted to the control line used for transferring the signal TXn causes a variation of the electric potential of the floating diffusion portion 145 via the transistor 140 of another set.

On the other hand, in the sixth exemplary embodiment, among a plurality of sets arranged in a plurality of columns in one row, some sets are connected to the control line used for transferring the signal TXn1_1, and the other sets are connected to the control line used for transferring the signal TXn1_2.

In the sixth exemplary embodiment, a connection portion connected to the input node and a predetermined node is the transistor 140. The predetermined node as used herein is the node of the photoelectric conversion portion 130.

This enables preventing or reducing a kickback noise generated at a differential stage 25 from being transmitted to another differential stage 25 via the control line used for transferring the signal TXn.

As described above, in the imaging device according to the sixth exemplary embodiment, with respect to a plurality of sets arranged in a plurality of columns in one row, a control line used for transferring the signal TXn_1 and a control line used for transferring the signal TXn_2 are arranged as a plurality of control lines. Then, the control line used for transferring the signal TXn_1 is connected to connection portions (transistors 140) of some sets of the plurality of sets. Then, the control line used for transferring the signal TXn_2 is connected to connection portions (transistors 140) of the other sets of the plurality of sets. This enables preventing or reducing a kickback noise caused by a change of the comparison result signal (signal Cout) output from the differential stage 25 of a set from being transmitted to the differential stage 25 of another set. With this, the imaging device according to the sixth exemplary embodiment has an advantageous effect of preventing or reducing a decrease in AD conversion accuracy caused by the kickback noise.

An imaging device according to a seventh exemplary embodiment is described with a focus on differences from those in the sixth exemplary embodiment.

Figure 16:
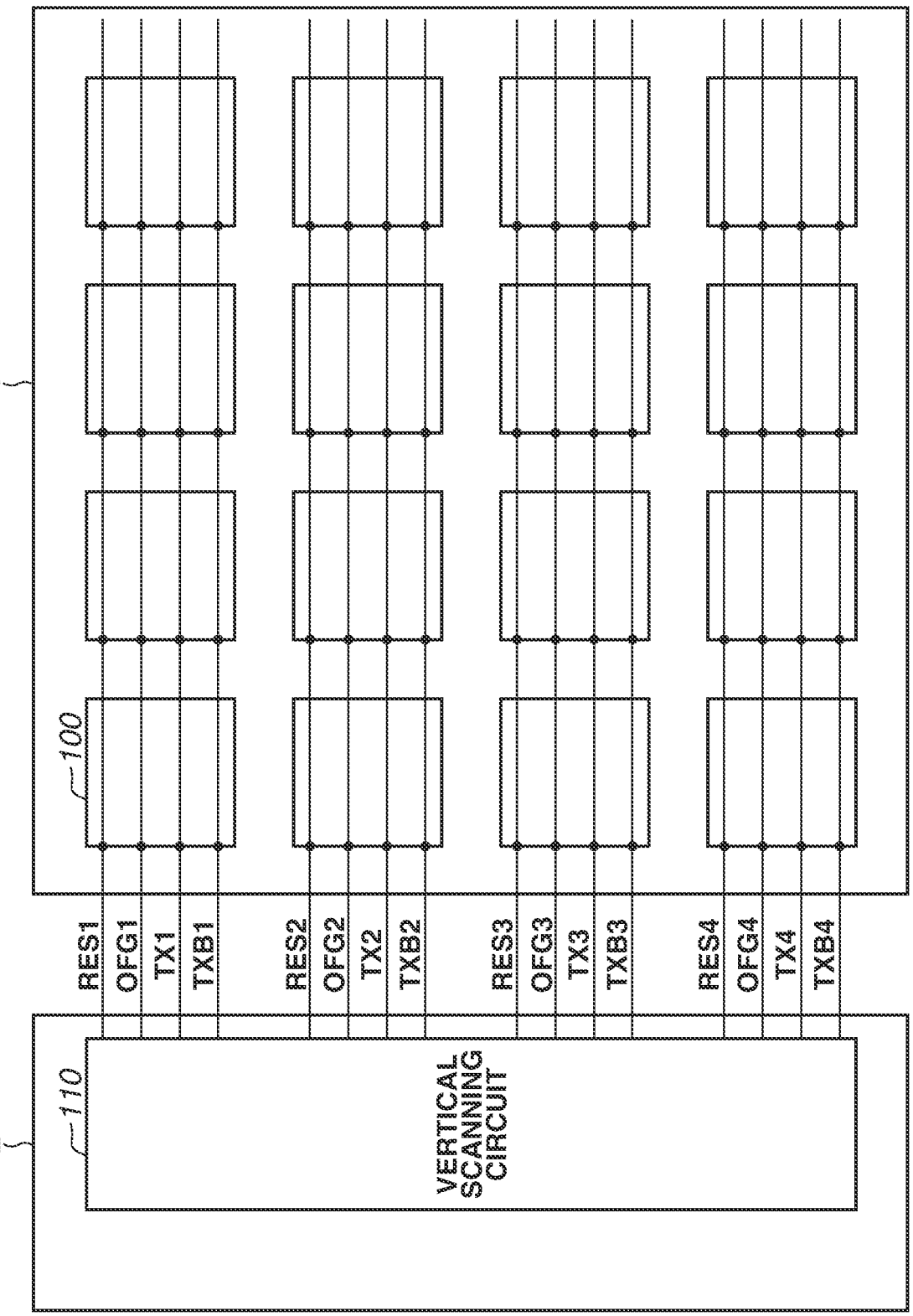
FIG. 16 is a circuit diagram of an imaging device according to a seventh exemplary embodiment.

FIG. 16 is a diagram illustrating a configuration of an imaging device according to the seventh exemplary embodiment. The imaging device according to the seventh exemplary embodiment outputs a signal TXn and a signal TXBn to pixels 100 in a plurality of columns in one row. Then, the pixels 100 in the plurality of columns are connected to a control line used for transferring the signal TXn in common. Moreover, the pixels 100 in the plurality of columns are connected to a control line used for transferring the signal TXBn in common.

Figure 17:
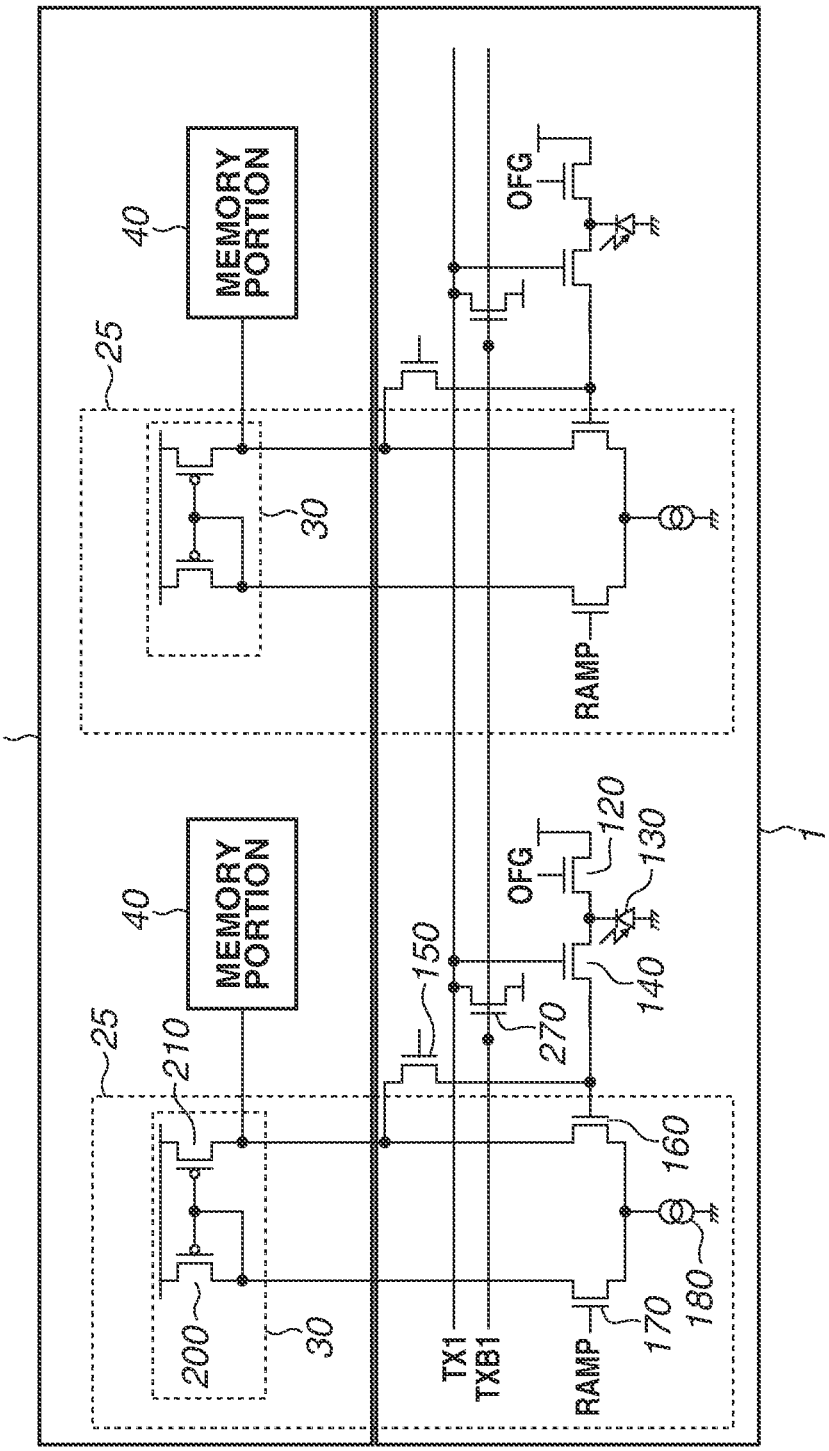
FIG. 17 is a circuit diagram of the imaging device according to the seventh exemplary embodiment.

FIG. 17 is a circuit diagram illustrating circuits of pixels 100 and signal processing circuits 105 in the imaging device illustrated in FIG. 16.

The pixel 100 in the seventh exemplary embodiment includes a transistor 270 illustrated in FIG. 17. One main node of the transistor 270 is connected to the control line used for transferring the signal TXn, and the other main node of the transistor 270 is connected to a node of a predetermined electric potential. The predetermined electric potential can be set to be the ground potential. Moreover, the control line used for transferring the signal TXBn is connected to the input node of the transistor 270.

The imaging device according to the seventh exemplary embodiment includes a transistor 150, which serves as a first transistor, having a node connected to the main node of the input transistor 160 and the current mirror circuit portion 30 and a node connected to the input node of the input transistor 160. Additionally, the imaging device according to the seventh exemplary embodiment includes the transistor 270, which serves as a second transistor, connected to the transistor 150 serving as the first transistor. The transistor 270 is a transistor which connects the input node of the transistor 150 serving as the first transistor and a predetermined node.

The signal TXBn is a signal opposite in phase to the signal TXn. More specifically, when the signal TXn is at high level, the signal TXBn is at low level. When the signal TXn is at low level, the signal TXBn is at high level.

The operation of the imaging device according to the seventh exemplary embodiment can be set to be the rolling shutter operation illustrated in FIG. 4 or the global shutter operation illustrated in FIG. 5. As mentioned above, the signal TXBn is a signal opposite in phase to the signal TXn.

During a period in which the AD conversion portion is performing AD conversion (the electric potential of the ramp signal is changing monotonously), the signal TXn is at low level. Furthermore, this low level is assumed to be the ground potential in the seventh exemplary embodiment. In a case where the signal TXn is at low level, the signal TXBn is at high level. Therefore, the control line used for transferring the signal TXn is connected to the node of a predetermined potential (typically, the ground potential) via the transistor 270 of each pixel 100. With this, in the control line used for transferring the signal TXn, an impedance to the node of the predetermined potential becomes small. Accordingly, even if a kickback noise caused by a change in signal level of the signal Cout output from a differential stage 25 is superposed on the control line used for transferring the signal TXn via the transistor 150, a variation of the electric potential of the control line caused by the kickback noise is prevented or reduced. Then, the electric potential of the control line can be statically set to the ground potential in a rapid manner Therefore, it is possible to prevent or reduce a kickback noise caused by a change in signal level of the signal Cout output from a differential stage 25 from being transmitted to another differential stage 25.

Figure 18:
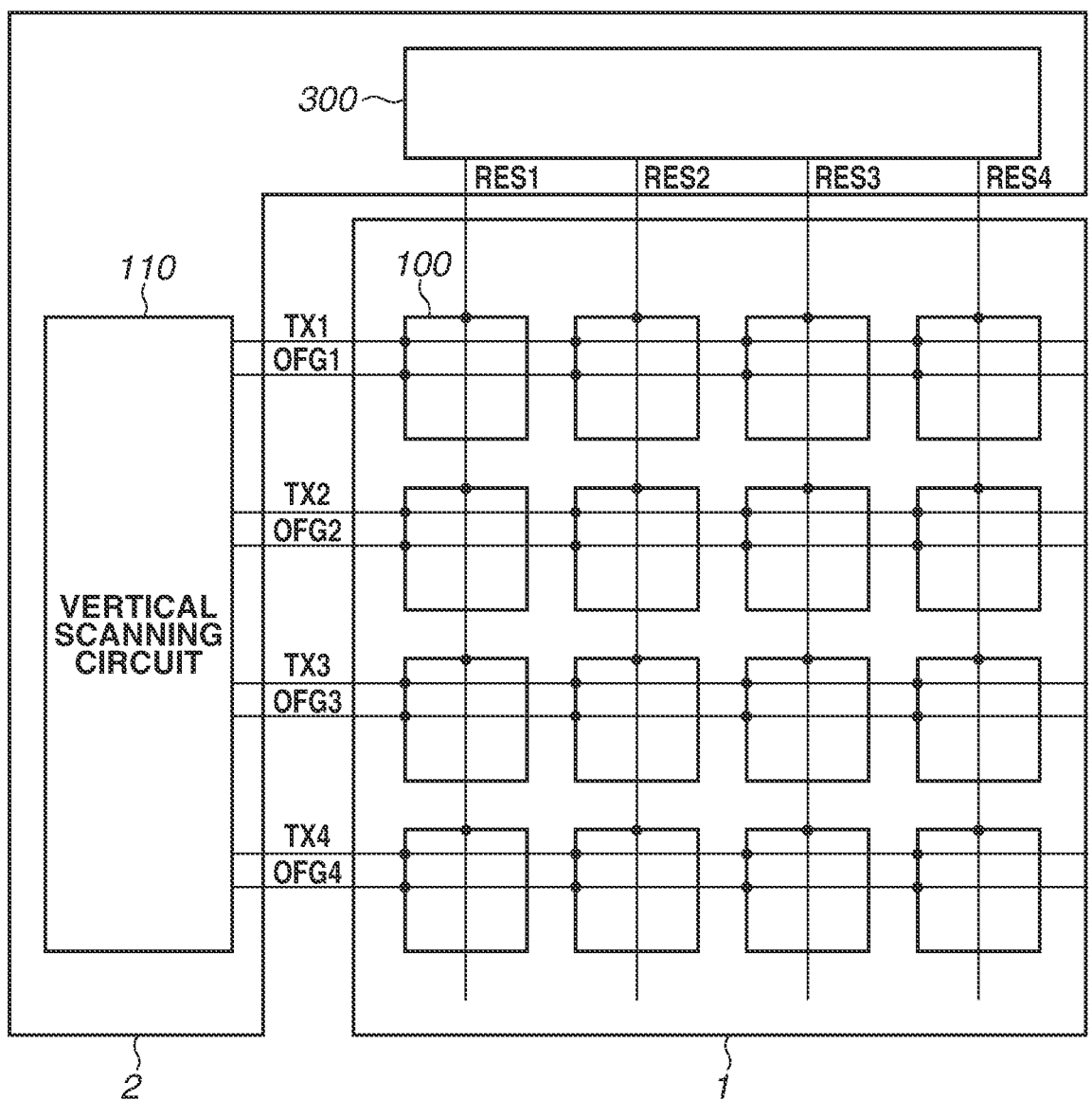
FIG. 18 is a circuit diagram of the imaging device according to the seventh exemplary embodiment.

Furthermore, in the above-described embodiments, an example in which a plurality of control lines used for transferring signals which are output by the vertical scanning circuit 110 extends in the same direction has been described. Each exemplary embodiment in the present specification is not limited to this example. For example, as illustrated in FIG. 18, control lines used for transferring signals RESn can be arranged in a plurality of rows in one column, and control lines used for transferring the other signals can be arranged in a plurality of columns in one row.

Figure 19:
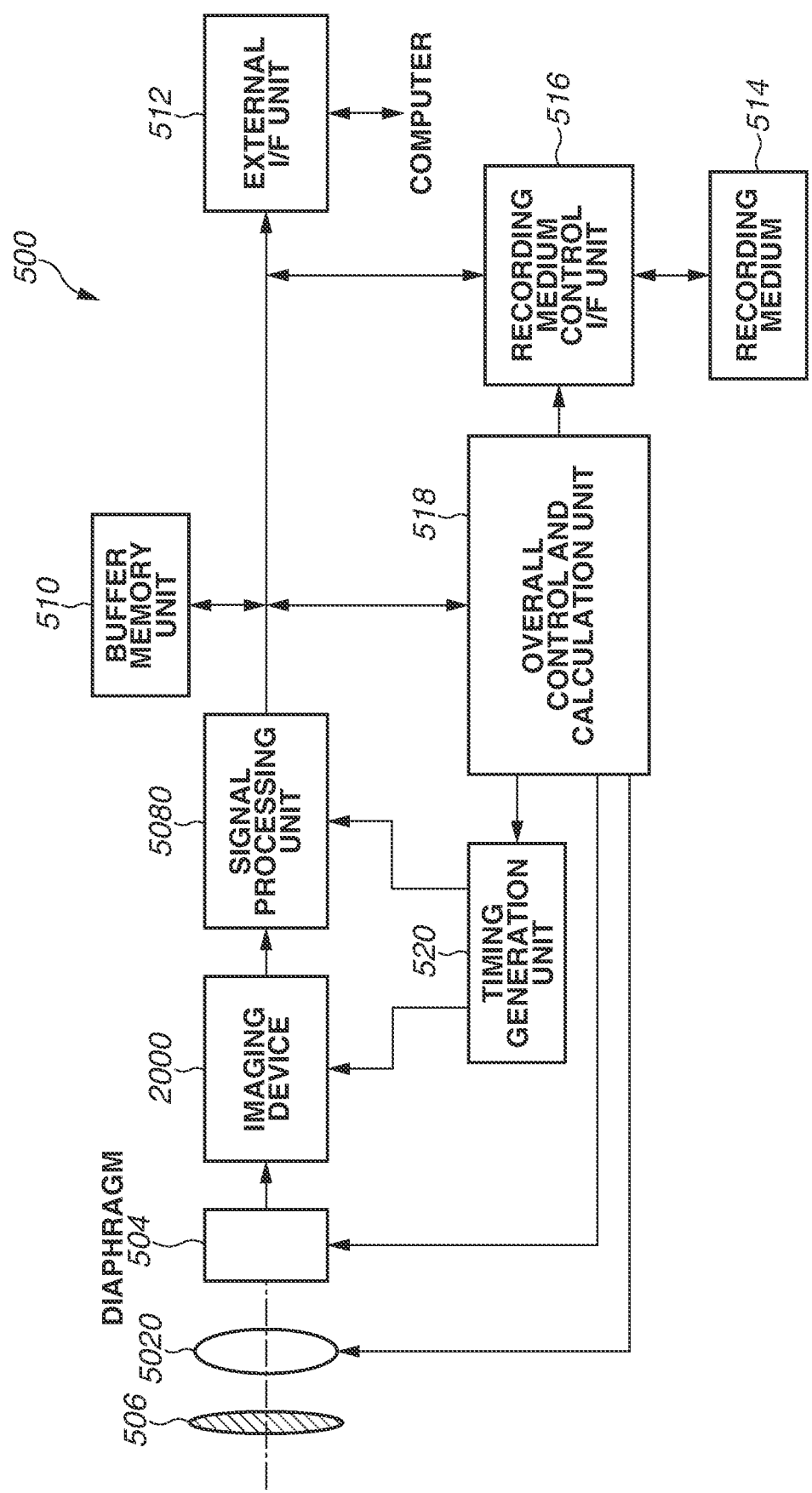
FIG. 19 is a block diagram of an imaging system according to an eighth exemplary embodiment.

FIG. 19 is a block diagram illustrating a configuration of an imaging system 500 according to an eighth exemplary embodiment. The imaging system 500 according to the eighth exemplary embodiment includes an imaging device 2000 to which the configuration of one of the imaging devices described in the respective above-described exemplary embodiments is applied. Specific examples of the imaging system 500 include a digital still camera, a digital camcorder, and a monitoring camera. FIG. 19 illustrates a configuration example of a digital still camera to which the configuration of one of the imaging devices described in the respective above-described exemplary embodiments is applied as the imaging device 2000.

The imaging system 500 illustrated in FIG. 19 as an example includes the imaging device 2000, a lens 5020, which focuses an optical image of a subject on the imaging device 2000, a diaphragm 504, which varies the amount of light passing through the lens 5020, and a barrier 506, which protects the lens 5020. The lens 5020 and the diaphragm 504 constitute an optical system which collects light onto the imaging device 2000.

The imaging system 500 further includes a signal processing unit 5080, which performs processing on an output signal output from the imaging device 2000. The signal processing unit 5080 performs an operation of signal processing for performing various correction and compression operations on the input signal as appropriate and then outputting the processed signal. The signal processing unit 5080 can include the function of performing AD conversion processing on the output signal output from the imaging device 2000. In this case, the inside of the imaging device 2000 does not necessarily need to include an AD conversion circuit.

The imaging system 500 further includes a buffer memory unit 510, which temporarily stores image data, and an external interface unit (external OF unit) 512, which performs communication with, for example, an external computer. Moreover, the imaging system 500 further includes a recording medium 514, such as a semiconductor memory, which is used to record or read out captured image data, and a recording medium control interface unit (recording medium control I/F unit) 516, which is used to perform recording or reading-out on the recording medium 514. Furthermore, the recording medium 514 can be incorporated in the imaging system 500 or can be configured to be attachable to and detachable from the imaging system 500.

Additionally, the imaging system 500 further includes an overall control and calculation unit 518, which not only performs various calculations but also controls the entire digital still camera, and a timing generation unit 520, which outputs various timing signals to the imaging device 2000 and the signal processing unit 5080. Here, the timing signals can be input from an outside source, and the imaging system 500 only needs to include at least the imaging device 2000 and the signal processing unit 5080, which processes an output signal output from the imaging device 2000. The overall control and calculation unit 518 and the timing generation unit 520 can be configured to perform a part or the whole of a control function for the imaging device 2000.

The imaging device 2000 outputs an image signal to the signal processing unit 5080. The signal processing unit 5080 performs predetermined processing on the image signal output from the imaging device 2000 and then outputs image data. Moreover, the signal processing unit 5080 generates an image using the image signal.

Configuring an imaging system with use of an imaging device corresponding to the imaging device according to each of the above-described exemplary embodiments enables implementing an imaging system capable of acquiring a higher-quality image.

An imaging system and a moving body according to a ninth exemplary embodiment are described with reference to FIGS. 20A and 20B and FIG. 21.

Figure 20A:
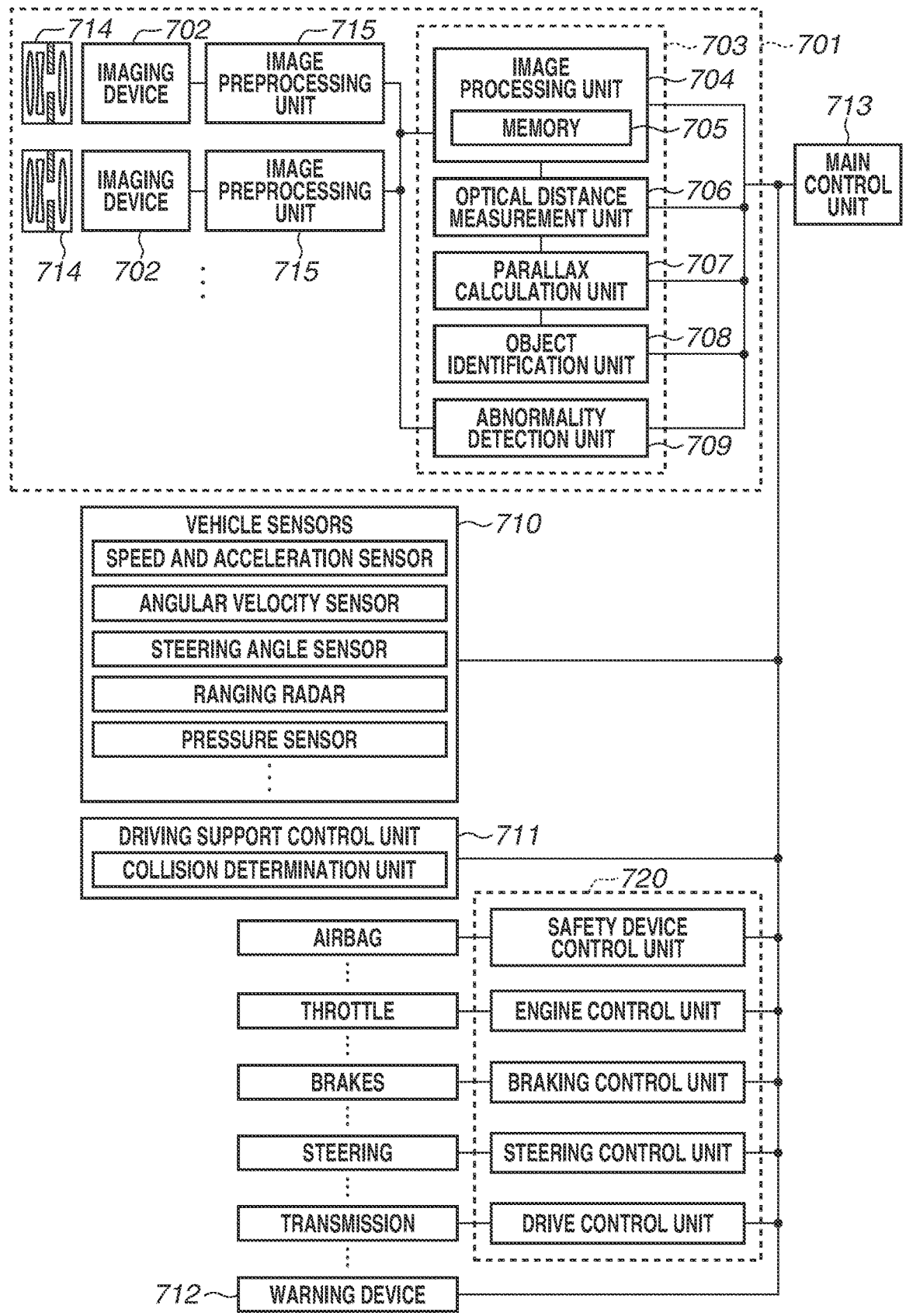
Figure 21:
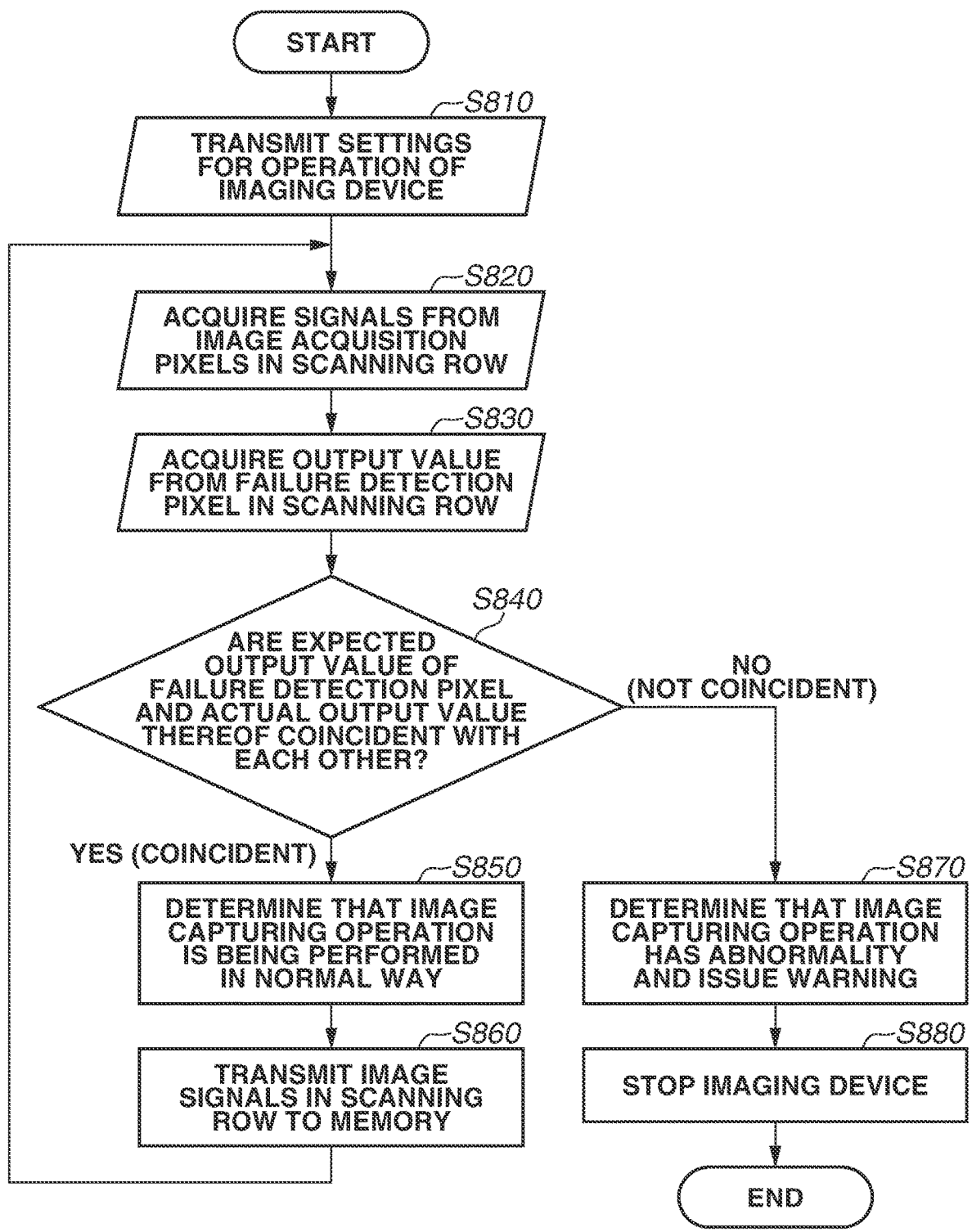
FIG. 21 is a diagram illustrating a signal processing flow of the imaging system according to the ninth exemplary embodiment.

FIGS. 20A and 20B are schematic diagrams illustrating respective configuration examples of the imaging system and the moving body according to the ninth exemplary embodiment. FIG. 21 is a flowchart illustrating an operation of the imaging system according to the ninth exemplary embodiment.

The ninth exemplary embodiment is directed to an example of an imaging system concerning a vehicle-mounted camera. FIG. 20A illustrates examples of a vehicle system and an imaging system mounted in the vehicle system. The imaging system 701 includes imaging devices 702, image preprocessing units 715, an integrated circuit 703, and optical systems 714. The optical system 714 focuses an optical image of a subject on the imaging device 702. The imaging device 702 converts an optical image of a subject focused by the optical system 714 into an electrical signal. The imaging device 702 is one of the imaging devices in the above-described exemplary embodiments. The image preprocessing unit 715 performs predetermined signal processing on a signal output from the imaging device 702. The function of the image preprocessing unit 715 can be incorporated in the imaging device 702. The imaging system 701 includes at least two sets each including the optical system 714, the imaging device 702, and the image preprocessing unit 715, and outputs from the image preprocessing units 715 of the respective sets are input to the integrated circuit 703.

The integrated circuit 703, which is an integrated circuit directed to an imaging system, includes an image processing unit 704, which includes a memory 705, an optical distance measurement unit 706, a parallax calculation unit 707, an object identification unit 708, and an abnormality detection unit 709. The image processing unit 704 performs image processing, such as development processing or defect correction, on output signals from the image preprocessing units 715. The memory 705 temporarily stores a captured image and stores defect positions of image capturing pixels. The optical distance measurement unit 706 performs focusing on a subject or distance measurement. The parallax calculation unit 707 performs calculation of a parallax (a phase difference of parallax images) from a plurality of pieces of image data acquired from a plurality of imaging devices 702. The object identification unit 708 performs identification of a subject, such as a car, a road, a sign, or a person. The abnormality detection unit 709 issues a warning to a main control unit 713 when detecting an abnormality in the imaging device 702.

The integrated circuit 703 can be implemented by hardware designed in a dedicated manner or can be implemented by a software module. Moreover, the integrated circuit 703 can be implemented by, for example, a field programmable gate array (FPGA) or an application specific integrated circuit (ASIC). The integrated circuit 703 can also be implemented by a combination of those.

The main control unit 713 comprehensively controls operations of, for example, the imaging system 701, vehicle sensors 710, and control units 720. Furthermore, a method in which, without the main control unit 713 being included, the imaging system 701, the vehicle sensors 710, and the control units 720 individually have communication interfaces and separately perform transmission and reception of control signals via a communication network (for example, a Controller Area Network (CAN) standard) can also be employed.

The integrated circuit 703 has the function of receiving control signals from the main control unit 713 and transmitting control signals or setting values to the imaging devices 702 via a control unit thereof. For example, the integrated circuit 703 transmits, for example, settings for pulse-driving a voltage switch (not illustrated) included in the imaging device 702 or settings for switching the voltage switch (not illustrated) in each frame.

The imaging system 701 is connected to the vehicle sensors 710 and is able to detect running conditions of the own vehicle itself, such as vehicle speed, yaw rate, and steering angle, an environment outside the own vehicle, and states of other cars or obstacles. The vehicle sensors 710 also serve as a distance information acquisition unit which acquires distance information from a parallax image to a target object. Moreover, the imaging system 701 is connected to a driving support control unit 711, which performs various driving support operations, such as self-steering, automatic cruise, and anti-collision function. Particularly, with regard to a collision determination function, the driving support control unit 711 predicts collision or determines the presence or absence of collision with other cars or obstacles based on a result of detection performed by the imaging system 701 or the vehicle sensors 710. With this, avoidance control in a case where collision is predicted or starting of a safety device at the time of collision is performed.

Moreover, the imaging system 701 is also connected to a warning device 712, which issues a warning to a driver based on a result of determination performed by the collision determination unit. For example, in a case where the probability of collision is high as a result of determination performed by the collision determination unit, the main control unit 713 performs vehicle control to avoid collision and reduce damage by, for example, applying brakes, returning the accelerator pedal, or decreasing engine power. The warning device 712 issues a warning to the user by sounding an alarm such as sound, displaying alarm information on the display unit screen of, for example, a car navigation system or a meter panel, or applying a vibration to a seat belt or a steering wheel.

In the ninth exemplary embodiment, the imaging system 701 captures an image of the surroundings of a vehicle, such as an image in front of or behind the vehicle. FIG. 20B illustrates an example of the arrangement of the imaging system 701 in a case where the imaging system 701 captures an image in front of the vehicle.

Two imaging devices 702 are located at a front portion of the vehicle 700. Specifically, when a center line relative to the forward and backward movement orientation or the outer shape (for example, the vehicle width) of the vehicle 700 is regarded as the axis of symmetry, locating two imaging devices 702 line-symmetrically with respect to the axis of symmetry is favorable in acquiring distance information between the vehicle 700 and a target object or determining collision probability. Moreover, it is favorable that the imaging devices 702 are located at positions which do not hinder the viewing field of a driver when the driver views the situation of the outside of the vehicle 700 from the driver's seat. It is favorable that the warning device 712 is located at a position which is likely to come in the viewing field of the driver.

Next, a failure detection operation of the imaging device 702 in the imaging system 701 is described with reference to FIG. 21. The failure detection operation of the imaging device 702 is performed according to steps S810 to S880 illustrated in FIG. 21.

Step S810 is a step of performing setting at the time of start-up of the imaging device 702. More specifically, the imaging system 701 transmits settings for an operation of the imaging device 702 from an external source of the imaging system 701 (for example, the main control unit 713) or from the inside of the imaging system 701, and starts an image capturing operation and a failure detection operation of the imaging device 702.

Next, in step S820, the imaging system 701 acquires pixel signals from effective pixels. Moreover, in step S830, the imaging system 701 acquires an output value from a failure detection pixel provided for failure detection. The failure detection pixel is also provided with a photoelectric conversion portion as with the effective pixels. A predetermined voltage is written into the photoelectric conversion portion. The failure detection pixel outputs a signal corresponding to the voltage written in the photoelectric conversion portion. Furthermore, step S820 and step S830 can be transposed.

Next, in step S840, the imaging system 701 determines whether the expected output value of the failure detection pixel and the actual output value of the failure detection pixel are coincident with each other.

If, as a result of determination of coincidence in step S840, it is determined that the expected output value and the actual output value are coincident with each other (YES in step S840), the processing proceeds to step S850, in which the imaging system 701 determines that the image capturing operation is being performed in a normal way, and, then, the processing proceeds to step S860. In step S860, the imaging system 701 transmits pixel signals in the scanning row to the memory 705 and temporarily stores the pixel signals therein. After that, the processing returns to step S820, in which the imaging system 701 continues the failure detection operation.

On the other hand, if, as a result of determination of coincidence in step S840, it is determined that the expected output value and the actual output value are not coincident with each other (NO in step S840), the processing proceeds to step S870. In step S870, the imaging system 701 determines that the image capturing operation has an abnormality and then issues a warning to the main control unit 713 or the warning device 712. The warning device 712 causes the display unit to display detection of the abnormality. After that, in step S880, the imaging system 701 stops the imaging device 702, thus ending the failure detection operation.

Furthermore, while, in the ninth exemplary embodiment, an example in which the flowchart is looped in every row has been described, the flowchart can be looped in every plurality of rows, or the failure detection operation can be performed in every frame.

Furthermore, the issuance of a warning in step S870 can be configured to be communicated to the outside of the vehicle via a wireless network.

Moreover, while, in the ninth exemplary embodiment, control for avoiding collision with other vehicles has been described, the ninth exemplary embodiment can also be applied to, for example, control for performing automatic driving while following another vehicle or control for performing automatic driving while avoiding drifting from the lane. Additionally, the imaging system 701 is not only applied to a vehicle such as an automobile but also can be applied to, for example, a moving body (moving apparatus), such as a boat or ship, aircraft, or an industrial robot. Besides, the imaging system 701 is not only applied to a moving body but also can be extensively applied to equipment utilizing object recognition, such as an intelligent transportation system (ITS).

Modification Examples

The present invention is not limited to the above-described exemplary embodiments but can be modified in various manners.

For example, an example in which some configurations of any one of the exemplary embodiments are added to another exemplary embodiment or an example in which some configurations of any one of the exemplary embodiments are replaced by some configurations of another exemplary embodiment is also an exemplary embodiment of the present invention.

Moreover, the above-described exemplary embodiments merely represent specific examples in implementing the present invention, and these examples are not intended to cause the technical scope of the present invention to be interpreted in a limited way. Thus, the present invention can be embodied in various manners without departing from the technical idea of the present invention or the principal features thereof.

According to the present invention, an imaging device with a decrease in AD conversion accuracy prevented or reduced can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imaging device comprising a plurality of sets, each set including a photoelectric conversion portion, a floating diffusion portion connected to the photoelectric conversion portion, and a differential stage,
    wherein the differential stage includes an input transistor having an input node connected to the floating diffusion portion,
    wherein each of the plurality of sets includes
    a first transistor
    connected to the input node and changing a capacitance connected to the input node, and
    wherein the first transistor and a second transistor connected to a main node of the input transistor are connected in series between the main node and the floating diffusion portion.

2. The imaging device according to claim 1,
    wherein each of the plurality of sets further includes a third transistor having a main node connected to a node at which the first transistor and the second transistor are connected to each other, and
    wherein the third transistor is a transistor which changes the capacitance value of the floating diffusion portion.

3. An imaging system comprising the imaging device according to claim 1, and a signal processing unit configured to process a signal output by the imaging device.

4. A moving body comprising the imaging device according to claim 1, wherein the moving body further comprises a control unit configured to control movement of the moving body.

5. The imaging device according to claim 1,
    wherein the differential stage includes a current mirror circuit portion connected to the main node of the input transistor.

6. The imaging device according to claim 5, further comprising a first chip and a second chip stacked on the first chip;
    wherein the photoelectric conversion portion, the floating diffusion portion, and a part of the differential stage are included in the first chip, and the current mirror circuit is included in the second chip.

7. The imaging device according to claim 1,
    wherein a charge generated by the photoelectric conversion portion is input to the input node.

8. An imaging device comprising a plurality of sets, each set including a photoelectric conversion portion, a floating diffusion portion connected to the photoelectric conversion portion, a transfer transistor for transferring a charge from the photoelectric conversion to the floating diffusion portion, and a differential stage,
    wherein the differential stage includes an input transistor having an input node connected to the floating diffusion portion, and a current mirror circuit portion connected to a main node of the input transistor,
    wherein each of the plurality of sets includes a first transistor provided in an electrical pathway positioned between a connection node at which the main node and the current mirror circuit portion are connected to each other and the input node,
    wherein a first control line is connected to transfer transistors of some sets of the plurality of sets, and
    wherein a second control line is connected to the transfer transistors of the other sets of the plurality of sets.

9. An imaging system comprising the imaging device according to claim 8, and a signal processing unit configured to process a signal output by the imaging device.

10. A moving body comprising the imaging device according to claim 8, wherein the moving body further comprises a control unit configured to control movement of the moving body.

11. The imaging device according to claim 8, further comprising a first chip and a second chip stacked on the first chip;
    wherein the photoelectric conversion portion, the floating diffusion portion, and a part of the differential stage are included in the first chip, and the current mirror circuit is included in the second chip.

12. The imaging device according to claim 8,
    wherein a charge generated by the photoelectric conversion portion is input to the input node.

* * * * *